US009521775B2

(12) United States Patent
Yamasaki

(10) Patent No.: US 9,521,775 B2
(45) Date of Patent: Dec. 13, 2016

(54) DRIVE APPARATUS

(71) Applicant: DENSO CORPORATION, Kariya, Aichi-pref. (JP)

(72) Inventor: Masashi Yamasaki, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/885,113

(22) Filed: Oct. 16, 2015

(65) Prior Publication Data

US 2016/0036286 A1 Feb. 4, 2016

Related U.S. Application Data

(62) Division of application No. 14/093,615, filed on Dec. 2, 2013, now Pat. No. 9,271,422.

(30) Foreign Application Priority Data

Nov. 30, 2012 (JP) ................................. 2012-262382
Aug. 26, 2013 (JP) ................................. 2013-174770

(51) Int. Cl.
*H05K 5/00* (2006.01)
*H05K 7/14* (2006.01)
*H02K 5/10* (2006.01)

(52) U.S. Cl.
CPC .............. *H05K 7/1432* (2013.01); *H02K 5/10* (2013.01)

(58) Field of Classification Search
USPC ....... 361/732, 748, 784–785, 688, 704, 709, 361/807, 809, 810; 439/625, 733.1, 947; 310/64, 71
See application file for complete search history.

(56) References Cited

U.S. PATENT DOCUMENTS

| 5,313,927 | A | 5/1994 | Takaishi | |
|---|---|---|---|---|
| 5,500,563 | A | 3/1996 | Kawaguchi et al. | |
| 6,302,747 | B1 * | 10/2001 | Bui | H01R 13/648 439/620.01 |
| 8,107,251 | B2 * | 1/2012 | Yamauchi | H05K 5/0069 361/730 |

(Continued)

FOREIGN PATENT DOCUMENTS

| JP | 54-096803 | 7/1979 |
|---|---|---|
| JP | 2-139457 | 11/1990 |

(Continued)

OTHER PUBLICATIONS

Uryu, et al., U.S. Appl. No. 13/952,087, filed Jul. 26, 2013.

(Continued)

*Primary Examiner* — Hung S Bui
(74) *Attorney, Agent, or Firm* — Nixon & Vanderhye PC

(57) ABSTRACT

A drive apparatus includes a power module, a connector and a heat sink. The connector is used for electric connection to an external side and has a flange, which is formed on its peripheral wall. The heat sink is formed to have a module holding part for holding the power module and a fitting hole for fitting with the flange and has a connector holding part for holding a connector. The flange is formed along a first surface, which faces the connector holding part of the peripheral wall, and side surfaces, which are formed on both sides of the first surface. Thus, water droplets are prevented from entering into a control unit through a clearance between the connector and the heat sink without adding other members such as a water preventing cover.

11 Claims, 35 Drawing Sheets

(56) References Cited

U.S. PATENT DOCUMENTS

| | | |
|---|---|---|
| 8,520,397 B2 | 8/2013 | Azumi et al. |
| 9,071,006 B2 * | 6/2015 | Ohhashi ............... H05K 5/0052 |
| 2003/0117914 A1 | 6/2003 | Kanaoka et al. |
| 2005/0167183 A1 | 8/2005 | Tominaga et al. |
| 2005/0206254 A1 | 9/2005 | Tsuge et al. |
| 2007/0215614 A1 * | 9/2007 | Matsui ................. H05K 5/0069 220/3.2 |
| 2013/0070432 A1 * | 3/2013 | Kawai ................. H05K 5/0052 361/752 |

FOREIGN PATENT DOCUMENTS

| | | |
|---|---|---|
| JP | 2002-095207 | 3/2002 |
| JP | 2009-046050 | 3/2009 |
| JP | 2010/280245 | 12/2010 |

OTHER PUBLICATIONS

Office Action (1 page) dated Nov. 27, 2014, issued in corresponding Japanese Application No. 2013-174770 and English translation (2 pages).

* cited by examiner

DRIVE APPARATUS

CROSS REFERENCE TO RELATED APPLICATION

This is a divisional of U.S. application Ser. No. 14/093,615, filed Dec. 2, 2013, which claims priority to, and incorporates herein by reference in their entirety, Japanese patent application Nos. 2012-262382 filed on Nov. 30, 2012 and No. 2013-174770 filed on Aug. 26, 2013.

FIELD

The present disclosure relates to a drive apparatus.

BACKGROUND

It is conventional, as disclosed in JP-A-2009-46050, for example, to arrange closely an electric motor and an electronic control unit, which are mounted in a vehicle, so that a loss of power caused by a wiring resistance, an increase of noise or an increase in the number of component parts may be reduced.

In a case that the electric motor and the control unit are arranged closely as in the above-referred patent document, the control unit occasionally need be placed at a position where water droplets fall depending on the position where the electric motor is mounted.

According to the patent document, therefore, a waterproof cover is provided to prevent water droplets from entering into the control unit. This waterproof cover necessarily increases the number of component parts.

SUMMARY

It is an object to provide a drive apparatus, which is capable of preventing water droplets from entering inside an electronic control unit without increasing the number of component parts.

According to one aspect, a drive apparatus comprises a semiconductor module, a connector and a holding member. The semiconductor module includes switching elements. The connector is provided for electrical connection with an external part and includes a peripheral wall and a first fitting part formed on the peripheral wall. The holding member includes a module holding part and a connector holding part. The module holding part holds the semiconductor module, and the connector holding part is provided with a second fitting part for fitting with the first fitting part and holding the connector. The first fitting part is formed on a first surface of the peripheral wall, which faces an accommodation bottom part of the connector holding part, and side walls, which are formed on both sides of the first surface.

EMBODIMENT

Figure 1:
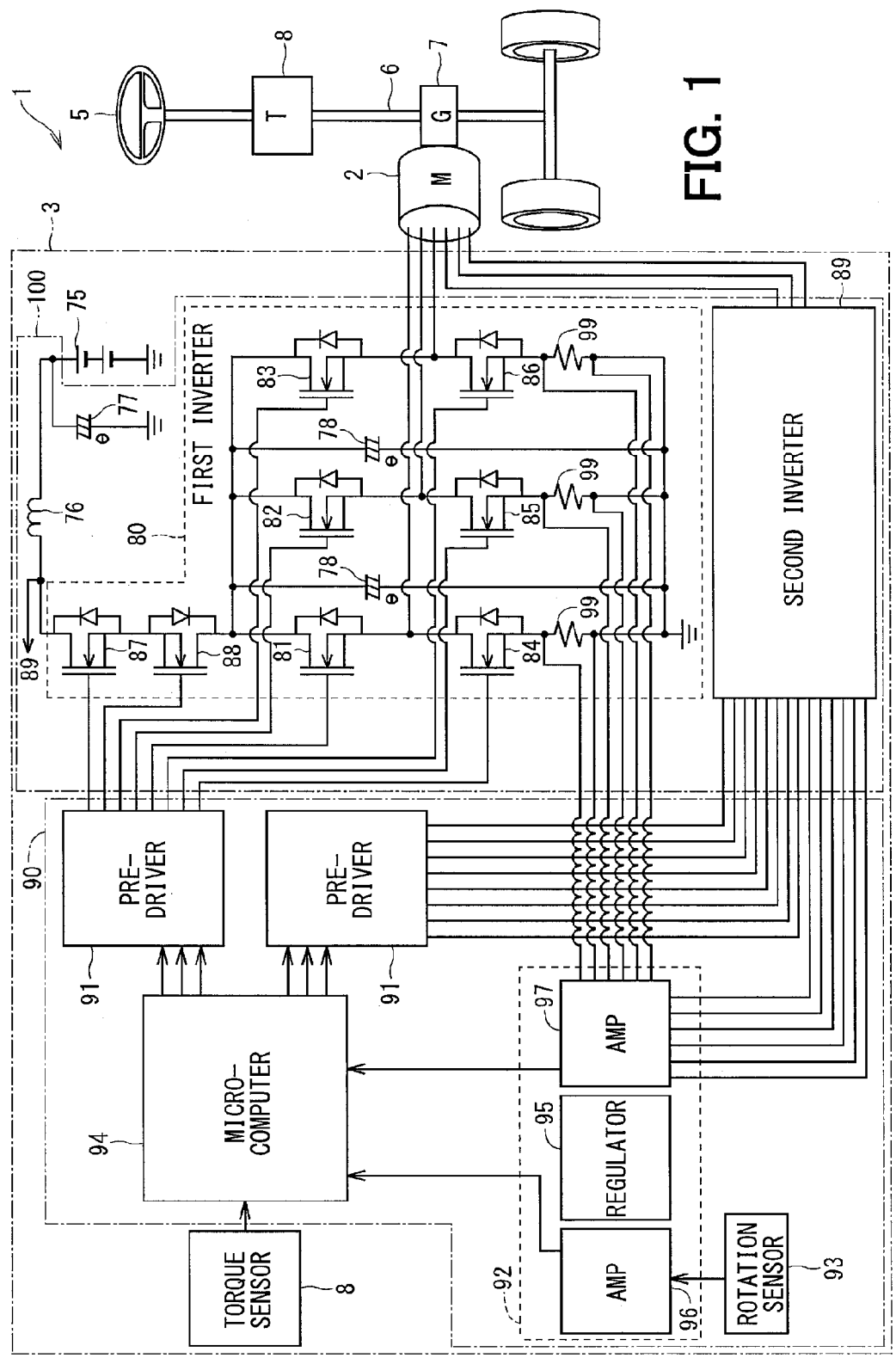
FIG. 1 is a electric circuit diagram of an electric power steering system, which uses a drive apparatus according to a first embodiment.

A drive apparatus will be described below with reference to plural embodiments, which are used in an electric power steering apparatus (EPS) for a vehicle as shown in the accompanying drawings. In the following embodiments, substantially the same configuration is designated with the same reference numerals for simplifying the description.

First Embodiment

A drive apparatus according to a first embodiment will be described with reference to FIG. 1 to FIG. 23. A drive apparatus 1 has a motor 2 as an electric motor device and an electronic control unit 3, which are integrated in a single body.

An electrical configuration of the EPS will be described first with reference to FIG. 1. As shown in FIG. 1, the drive apparatus 1 is configured to apply a rotary torque to a column shaft 6, which is a rotary shaft of a steering wheel 5 of a vehicle, through a gear 7 attached to the column shaft 6 thereby to power-assist steering operation of the steering wheel 5. Specifically, when the steering wheel 5 is operated by a driver, a steering torque applied to the column shaft 6 by the steering operation is detected by a torque sensor 8. Vehicle information is acquired through a CAN (controller area network). The drive apparatus 1 thus assists the steering operation of the driver on the steering wheel 5.

The motor 2 is a three-phase brushless motor, which rotates the gear 7 in normal and reverse directions. The motor 2 is driven by current supply, which is controlled by the control unit 3. The control unit 3 is formed of a power circuit 100, which supplies drive currents for driving the motor 2, and a control circuit 90 for controlling driving of the motor 2.

The power circuit 100 includes a choke coil 76, which is connected in a power line extending from a power source 75, a capacitor 77 and two (first and second) inverters 80, 89. The inverter 80 and the inverter 89 has the same configuration and hence description will be made about the inverter 80. In the inverter 80, MOSFETs (metal-oxide-semiconductor field-effect transistor, which is hereinafter referred to as FET) 81 to 86 are connected in a bridge. Each FET 81 to 86 is turned on (conduction) or off (non-conduction) between its source-drain path in accordance with its gate potential. Each of the FETs 81 to 86 corresponds to a switching element.

The inverter 80 includes power relays 87, 88. The power relays 87, 88 are also MOSFETs similar to FETs 81 to 86. The power relays 87, 88 are connected between the FETs 81 to 83 and the power source 75 and are capable of shutting off current flow upon an occurrence of abnormality. The power relay 87 is provided to shut off current flow to the motor 2 side upon an occurrence of a failure such as wire-breakage or short-circuit. The power relay 88 is provided to prevent current flow in the reverse direction in a case that an electronic component such as the capacitor 78 is erroneously connected in reverse polarity.

Shunt resistors 99 are connected electrically between the FETs 84 to 89 and the ground, respectively. A current supplied to each phase of a winding set 13 is detected by detecting a voltage or current applied to the shunt resistor 99.

The choke coil 76 and the capacitor 77 are connected electrically between the power source 75 and the power relay 87. The choke coil 76 and the capacitor 77 form a filter circuit, which suppresses noises transmitted from other apparatuses, which share the power source 75. Further, the filter circuit suppresses noises transmitted to the other apparatuses, which share the power source 75.

The capacitor 78 is connected electrically between the power source side of the FETs 81 to 83, which are provided on the power line side, and the ground side of the FETs 84 to 86, which are provided on the ground side. The capacitor 78 stores charges therein to assist power supply to the FETs 81 to 86 and suppress noise components such as surge voltages.

The control circuit 90 includes a pre-driver 91, a customized IC 92, a rotation angle sensor 93 and a microcomputer 94. The customized IC 92 includes, as function blocks, a regulator 95, a rotation angle sensor signal amplifier 96 and a detection voltage amplifier 97. The regulator 95 is a stabilization circuit, which stabilizes voltages supplied to various parts. The microcomputer 94, for example, operates with a predetermined voltage (for example, 5V) supplied from the regulator 95.

The rotation angle sensor signal amplifier 96 receives a signal form the rotation angle sensor 93. The rotation angle sensor 93 detects a rotation position signal of the motor 2. The detected rotation position signal is transmitted to the rotation angle sensor signal amplifier 96. The rotation angle sensor signal amplifier 96 amplifies the rotation position signal and outputs the amplified signal to the microcomputer 94. The detection voltage amplifier 97 detects a voltage across both terminals of each shunt resistor 99, amplifies the detected voltage and outputs the amplified voltage to the microcomputer 94.

The microcomputer 94 receives the rotation position signal of the motor 2, the terminal voltages of the shunt resistor 99, the steering torque signal of the torque sensor 8, the vehicle speed information of CAN and the like. The microcomputer 94 controls the inverter 80 based on the inputted various information so that the motor 2 generates an output torque, which attains a desired torque. Specifically, the microcomputer 94 controls the inverter 80 by switching over ON/OFF of the FETs 81 to 86 through the pre-driver 91. Thus, the motor 2 is driven to assist the steering operation of a driver on the steering wheel 5. The microcomputer 94 further switches over ON/OFF of the power relays 87, 88. The microcomputer 94 also controls the inverter 89 similarly to the inverter 80.

Figure 2:
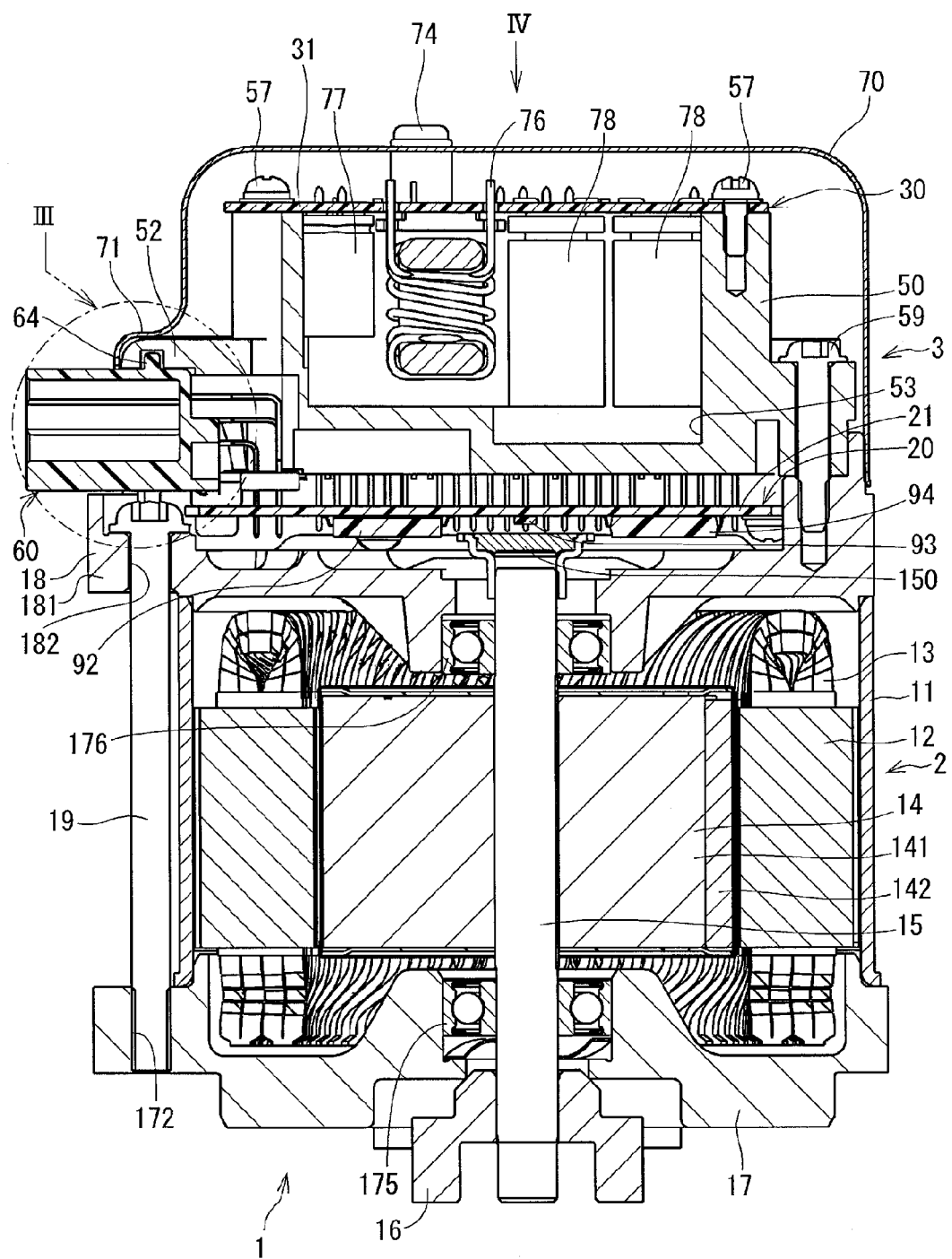
FIG. 2 is a sectional view of the drive apparatus according to the first embodiment.
Figure 3:
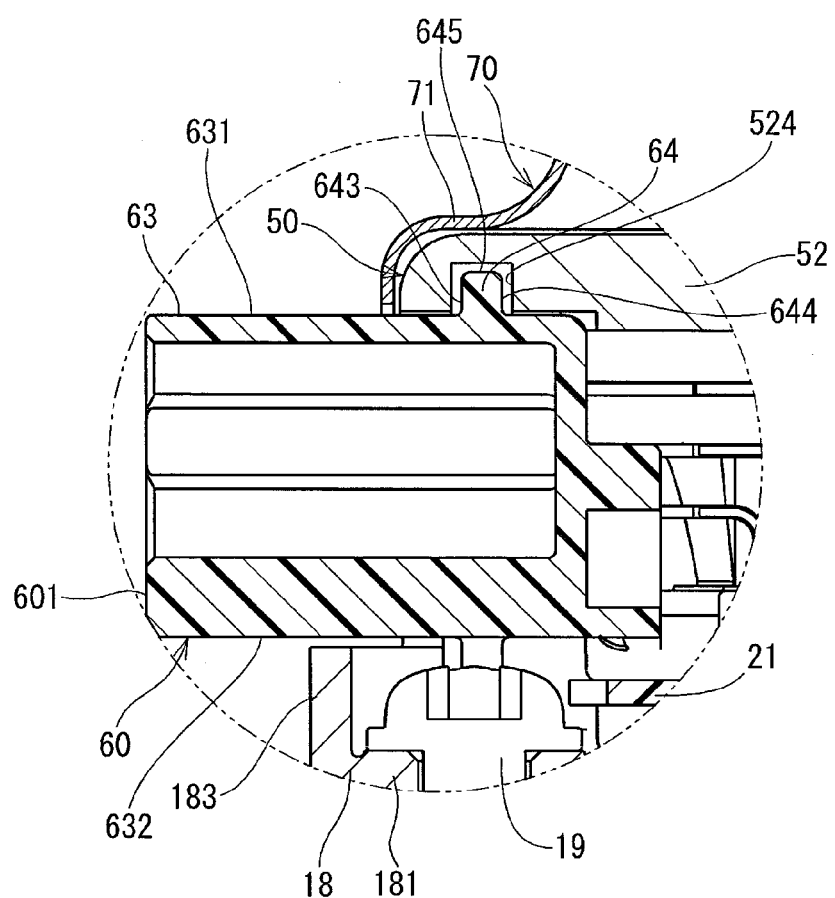
FIG. 3 is an enlarged view of a part III in FIG. 2.
Figure 4:
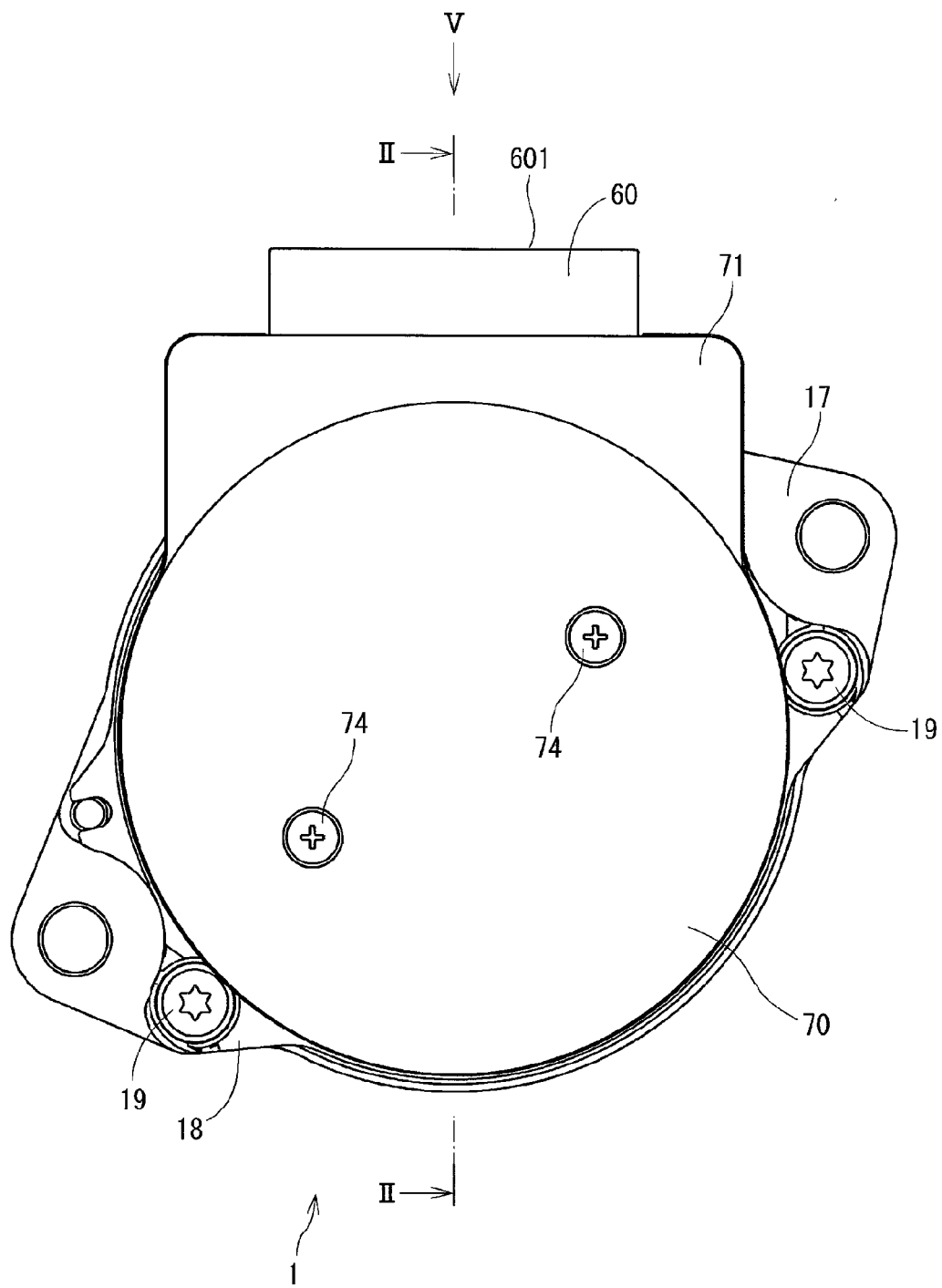
FIG. 4 is a top plan view of the drive apparatus taken in an arrow direction IV in FIG. 2.
Figure 5:
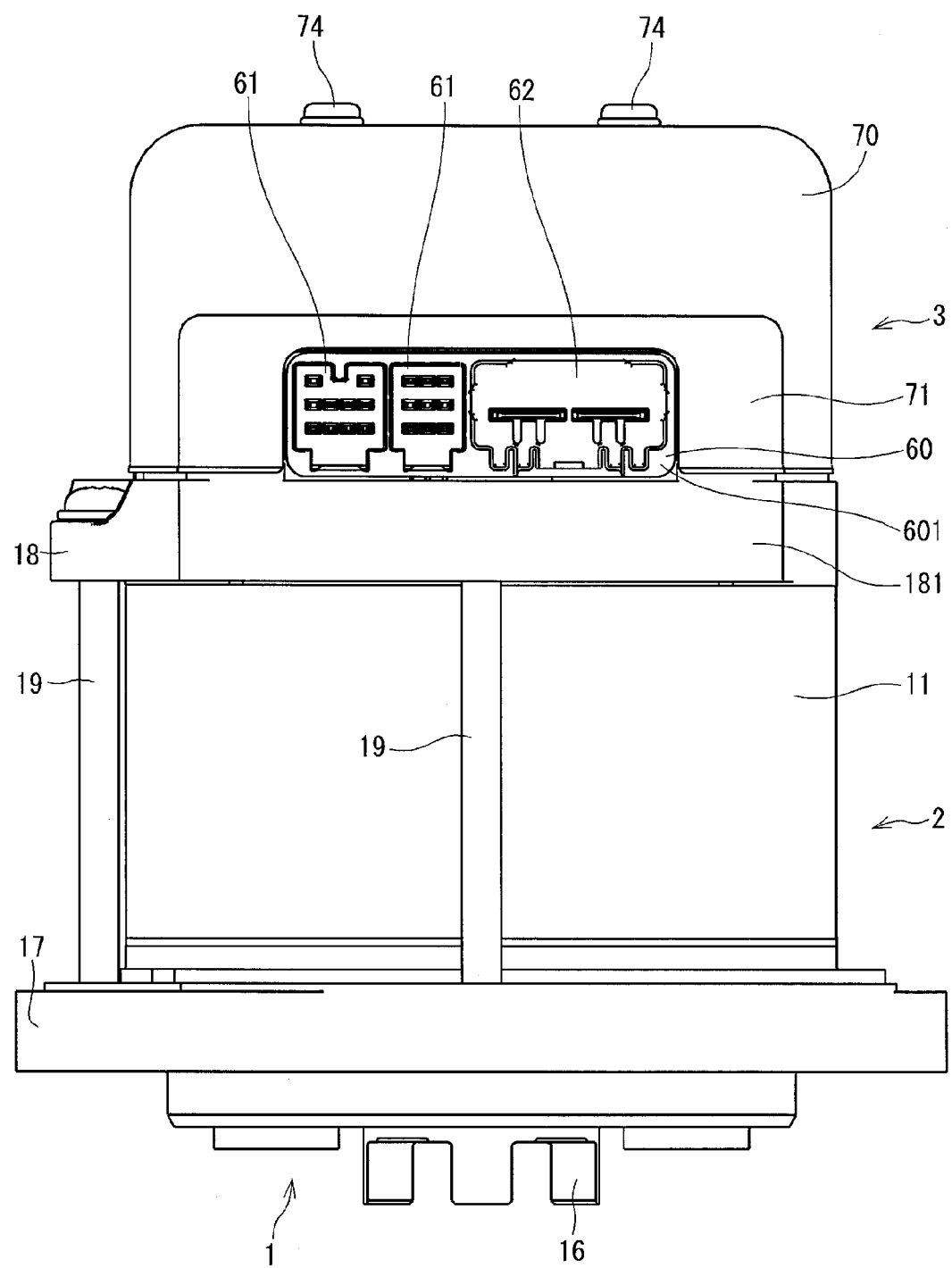
FIG. 5 is a side view of the drive apparatus taken in an arrow direction V in FIG. 4.
Figure 6:
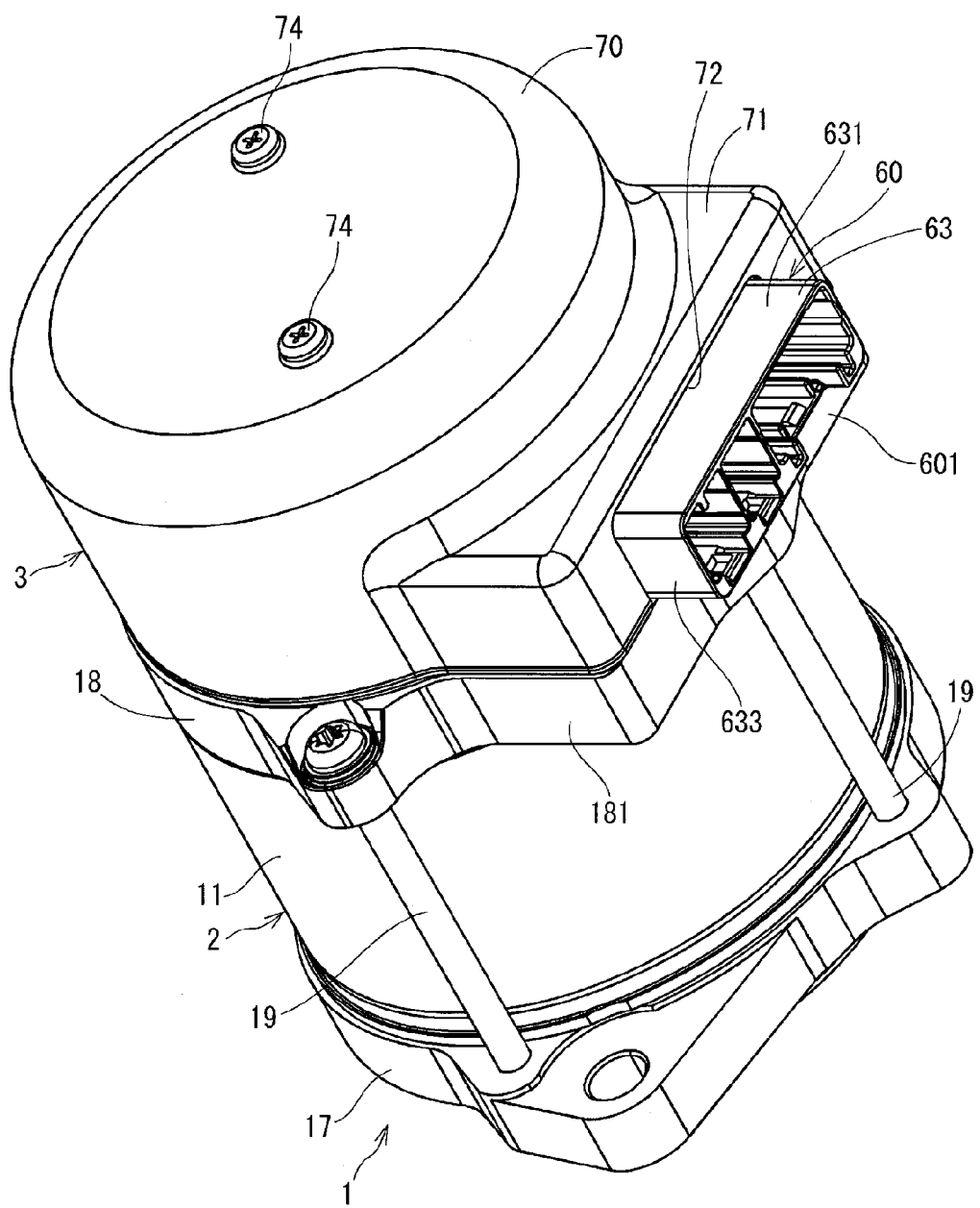
FIG. 6 is a perspective view of the drive apparatus viewed from the top side.

As shown in FIG. 2, the motor 2 is formed of a motor case 11, a stator 12, a winding set 13, a rotor 14, a shaft 15, an output end 16, a front end frame 17 on a bottom side, a rear end frame 18 on a top side and the like. The motor case 11 is formed of a metal in generally a cylindrical shape, for example. The stator 12 includes a stack part, in which thin plates of magnetic materials such as iron are stacked, and an insulator, which is fitted on an outside of the stack part in the axial direction. The stator 12 is fixed to the inside of the motor case 11 and accommodated in the motor case 11. The number of thin plates used for the stack part of the stator 12 is variable in accordance with the output, which the motor 2 is required to generate. Thus, it is possible to change the output power of the motor 2 by changing only the length of the stack part in the axial direction without changing the size of the stack part in the radial direction.

Figure 7:
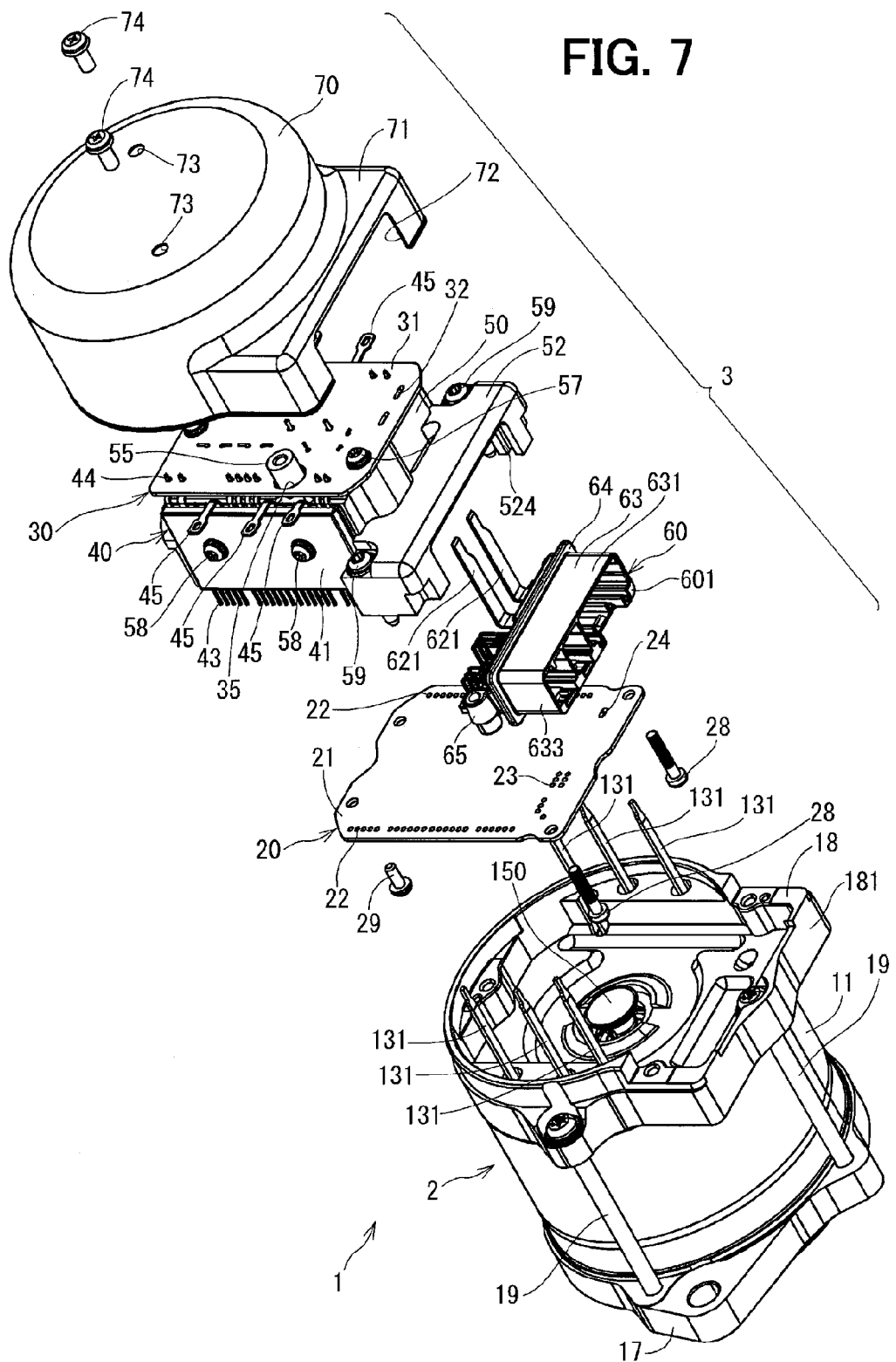
FIG. 7 is an exploded perspective view of the drive apparatus shown in FIG. 6.
Figure 8:
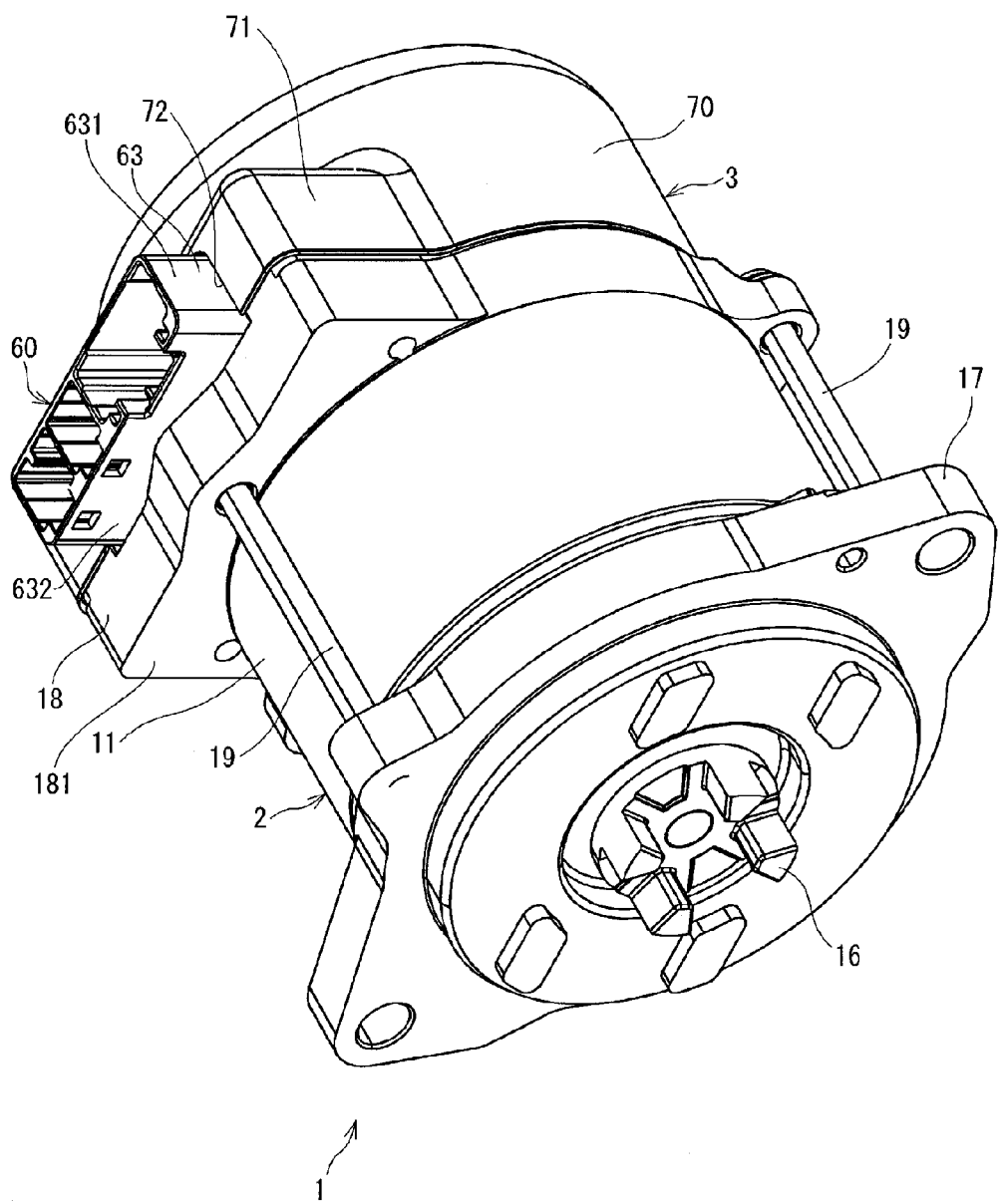
FIG. 8 is a perspective view of the drive apparatus viewed from the bottom side.
Figure 9:
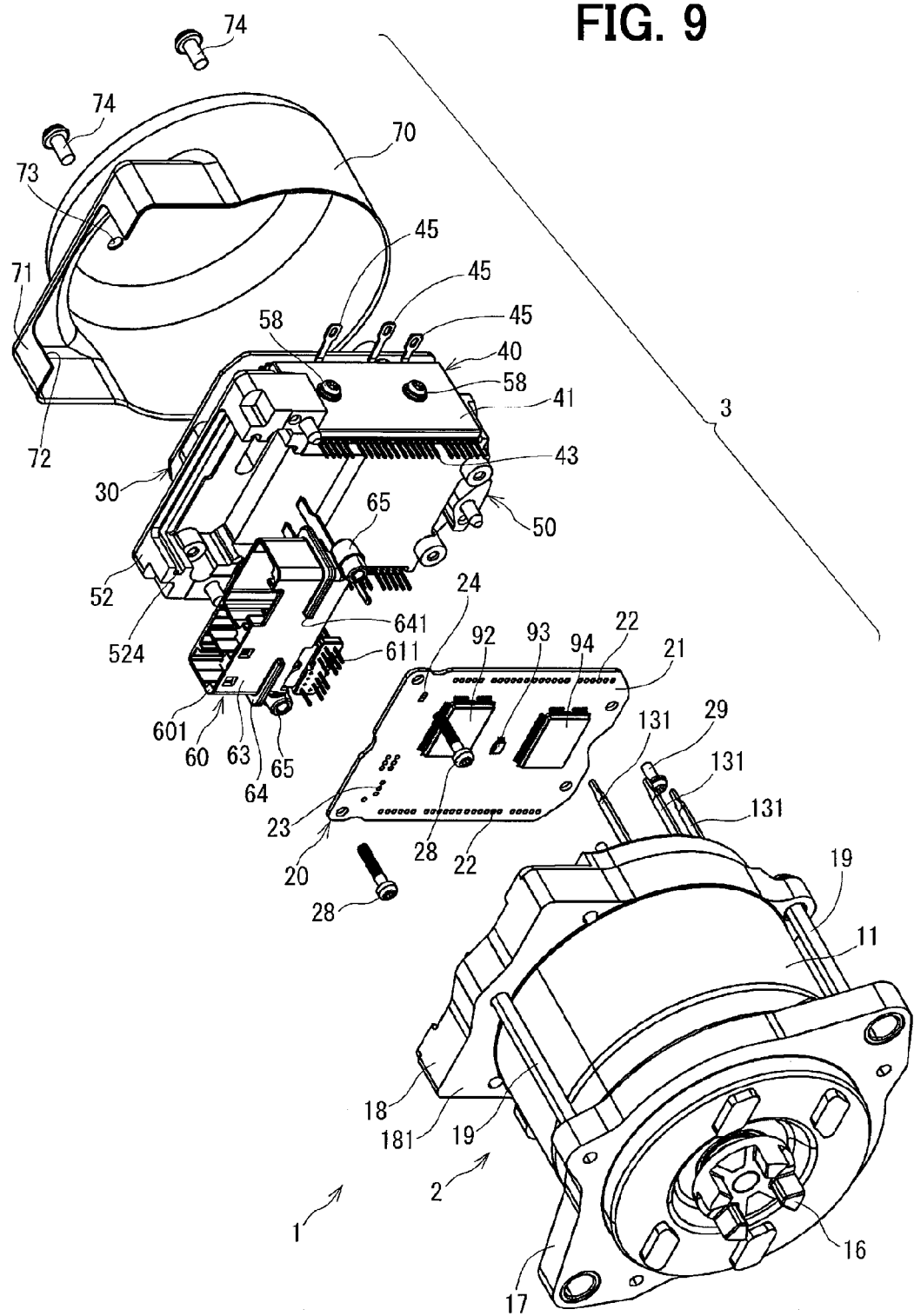
FIG. 9 is an exploded perspective view of the drive apparatus shown in FIG. 8.

The winding set 13 is wound about the insulator of the stator 12. The winding set 13 forms a three-phase coil set, which includes a U-phase coil, a V-phase coil and a W-phase coil. The winding set 13 provides two sets of three-phase coils. Assuming that one set of three-phase coil corresponds to one power supply path, the drive apparatus 1 has two power supply paths. Lead wires 131 for the phases extend from the winding set 13 in each of the power supply paths (FIG. 7 and FIG. 9). That is, six lead wires 131 are taken out from the winding set 13 in the motor case 11 toward the control unit 3, which are mounted on the top side of the motor 2.

The rotor 14 has a rotor core 141 and permanent magnets 142. The rotor core 141 is formed of a magnetic material such as iron in a generally cylindrical shape and provided inside the stator 12 coaxially with the stator 12. The permanent magnets 142 are provided radially outside the rotor core 141 such that a N-pole and a S-pole are arranged alternately in the circumferential direction.

The shaft 15 is formed of a metal, for example, in a rod shape and fixed in the rotation axis center of the rotor core 141. The shaft 15 is borne and supported rotatably by a bearing 175 provided in the front end frame 17 and a bearing 176 provided in the rear end frame 18. Thus the shaft 15 is rotatable with the rotor 14. A cylindrical air gap is formed between the outer wall of the rotor 14 (permanent magnets 142) and the inner wall of the stator 12.

The output section 16 is formed of, for example, a metal and provided at an axial end part of the shaft 15 at a side protruding from the front end frame 17. The output section 16 has four protrusion parts protruding in the axial direction of the shaft 15 and these protrusions are coupled to the gear 7. Thus, the rotation of the rotor 14 and the shaft 15 is outputted to the gear 7.

The front end frame 17 is formed of a metal, for example, in a generally disk shape and provided to close the bottom end part of the motor case 11, which is opposite to the control unit 3 side in the axial direction. The rear end frame 18 is made of a metal, for example, in a disk shape and provided to close the axial end part of the motor case 11, which is on the control unit 3 side. That is, an outer peripheral shape is defined by the motor case 11, the front end frame 17 and the rear end frame 18.

A connector receiving part 181, in which an electric connector 60 is arranged, is formed at one side of the rear end frame 18, which is on the control unit 3 side. The connector receiving part 181 is formed to protrude in the radially outward direction. The relation between the rear end frame 18 and the connector 60 will be described later. The rear end frame 18 is a frame member.

Through bolts 19 are inserted into front hole parts 172 formed in the front end frame 17 and rear hole parts 182 formed in the rear end frame 18 thereby to tightly hold the front end frame 17 and the rear end frame 18. Thus, tightening force of the through bolts 19 exerts in the axial direction under a state that the motor case 11 is sandwiched between the front end frame 17 and the rear end frame 18.

A magnet 150 is provide at a part of the shaft 15 protruding from the rear end frame 18, that is, at an axial end part, which is on the control unit 3 side. The magnet 150 is provided coaxially with the shaft 15 to rotate together with the shaft 15.

As shown in FIG. 2 to FIG. 9, the control unit 3 is provided on the rear end frame 18 side of the motor 2 generally coaxially with the motor 2. The control unit 3 is sized to be diametrically within an area (referred to as a motor area), which is formed by projection of the motor 2 in the axial direction. As shown in FIG. 2, FIG. 7 and FIG. 9, the control unit 3 includes a control wiring part (control circuit part) 20, a power wiring part (power circuit part) 30, a power module 40 as a semiconductor module, a heat sink 50 as a holding member, the connector 60, a cover member 70 and the like. In the control unit 3, the control wiring part 20, the power module 40 as well as the heat sink 50, and the power wiring part 30 are arranged in this order from the motor 2 side in the axial direction.

The control wiring part 20 includes a control circuit board 21. The control circuit board 21 is formed in a plate shape, which is sized to be radially within the motor area, and provided on the motor 2 side of the heat sink 50. The control circuit board 21, specifically its connector 60 side (top side), is screw-fixed together with the connector 60 to the heat sink 50 by long screws 28. The control circuit board 21, specifically its bottom side, in which the connector 60 is not provided, is screw-fixed directly to the heat sink 50 by short screws 29 without through the connector 60.

Various electronic components forming the control circuit 90 such as the customized IC 92, the microcomputer 94 and the rotation angle sensor 93 are mounted on a bottom surface of the control circuit board 21, which is on the motor 2 side. The rotation angle sensor 93 is provided at a position facing the magnet 150 to detect a rotation position of the rotor 14 by detecting the magnetic field varying with rotation of the magnet 150.

The power wiring part 30 includes a power circuit board 31. The power circuit board 31 is formed in a plate shape, which is sized to be radially within motor area, and provided on the heat sink 50 on the top side, which is opposite to the motor 2 side. The power circuit board 31 is screw-fixed to the heat sink 50 by a screw 57. The choke coil 76 and the capacitors 77, 78 are mounted on the power circuit board 31 on the same side as the heat sink 50. The choke coil 76 and the capacitors 77, 78, which are mounted on the power circuit board 31, are accommodated in an accommodation recess part 53 of the heat sink 50.

The power module 40 includes a mold part 41, control terminals 43, power terminals 44, motor terminals 45, FETs 81 to 86, power relays 87, 88 (FIG. 1) and the like. The power module 40 includes therein, as a module, FETs 81 to 86, which are switching elements for switching over power supply to the winding set 13, the power relays 87, 88 and the shunt resistors 99 for each power supply path. The drive apparatus 1 is formed of two power supply paths and hence two power modules 40 are provided. In the power module 40, the FETs 81 to 86, the power relays 87, 88 and the shunt resistors 99 are mounted on a wiring pattern formed of, for example, copper, electrically connected by wires or the like and molded by the mold part 41.

Control terminals 43 are provided in the mold part 41 on one side (bottom side) in the longitudinal direction (top-bottom direction) as shown in FIG. 7. The control terminals 43 are inserted into holes 22, which are formed along the outer periphery of the control circuit board 21 extending in the longitudinal direction, and electrically connected to the control circuit board 21 by soldering or the like. The power terminals 44 are provided in the mold part 41 on the other side (top side) in the longitudinal direction. The power terminals 44 are inserted into holes formed in the power circuit board 31 in correspondence to the power terminals 44 and electrically connected to the power circuit board 31 by soldering or the like.

The motor terminals 45, which correspond to three-phases of the winding set 13, are provided on the side of the mold part 41, on which the power terminals 44 are provided. The motor terminals 45 are bent radially outwardly of the motor 2 and connected to the lead wires 131 of the motor 2 in correspondence. Thus the power module 40 and the winding set 13 are electrically connected. The lead wires 131 are arranged with a space relative to the power module 40 in the radial direction so that the lead wires 131 do not contact the power module 40 and the heat sink 50.

The power terminals 44 and the motor terminals 45, to which a large current is supplied, are arranged on the power wiring part 30 side, that is, oppositely to the control wiring part 20 sandwiching the heat sink 50. That is, areas for large current supply are arranged to be physically spaced away from the control wiring part 20 in the axial direction. Thus, influence of noise arising from the large current supplied to the power wiring part 30 and the like can be reduced in the control wiring part 20.

The power module 40 is arranged vertically along a module holding part 51 of the heat sink 50 and screw-fixed by screws 58 in the radial direction so that the control terminals 43 are on the control circuit board 21 side and the power terminals 44 as well as the motor terminals 45 are on the power circuit board 31 side. Thus, the power module 40 is fixedly held by the heat sink 50. The wide area surface of the power module 40 and the module holding part 51 of the heat sink 50 contact each other and hence heat generated by an operation of the power module 40 is radiated through the heat sink 50. Although not shown, a heat radiating sheet may be sandwiched between the power module 40 and the heat sink 50.

Figure 10:
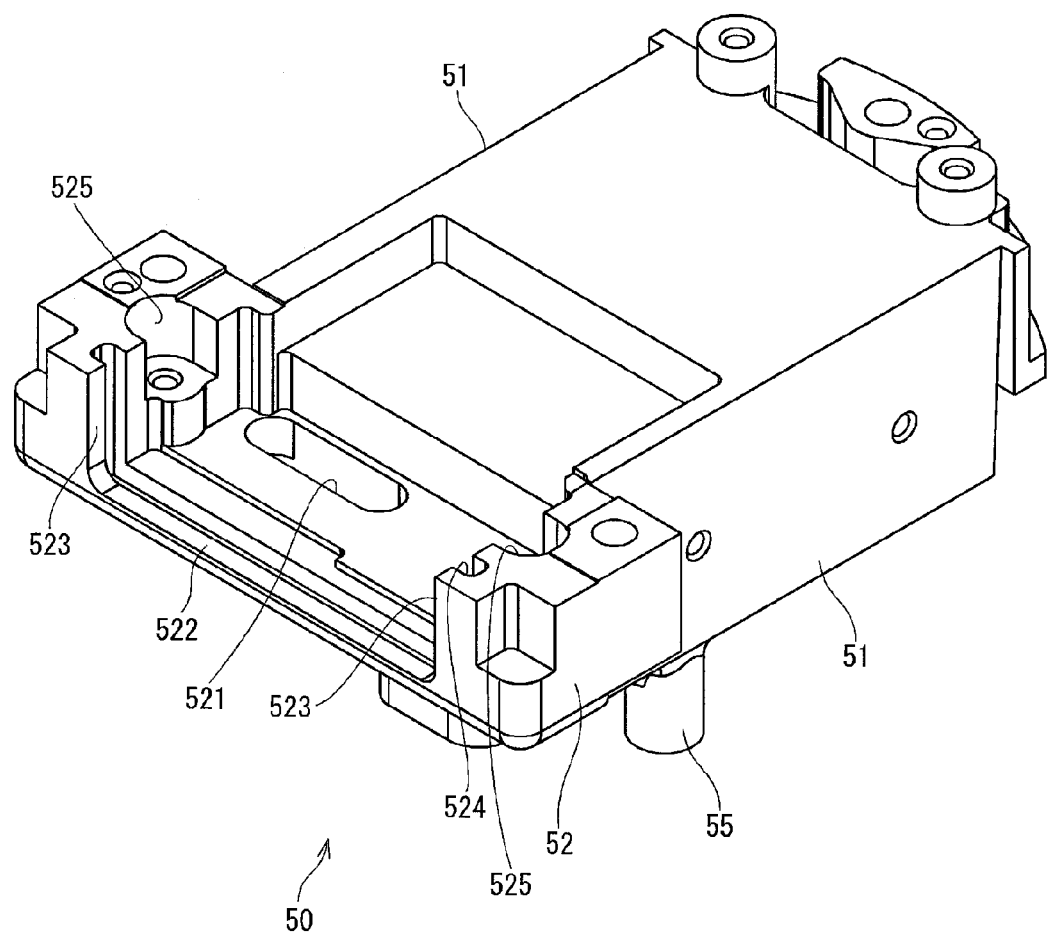
FIG. 10 is a perspective view of a heat sink provided in the drive apparatus viewed from the bottom side.
Figure 11:
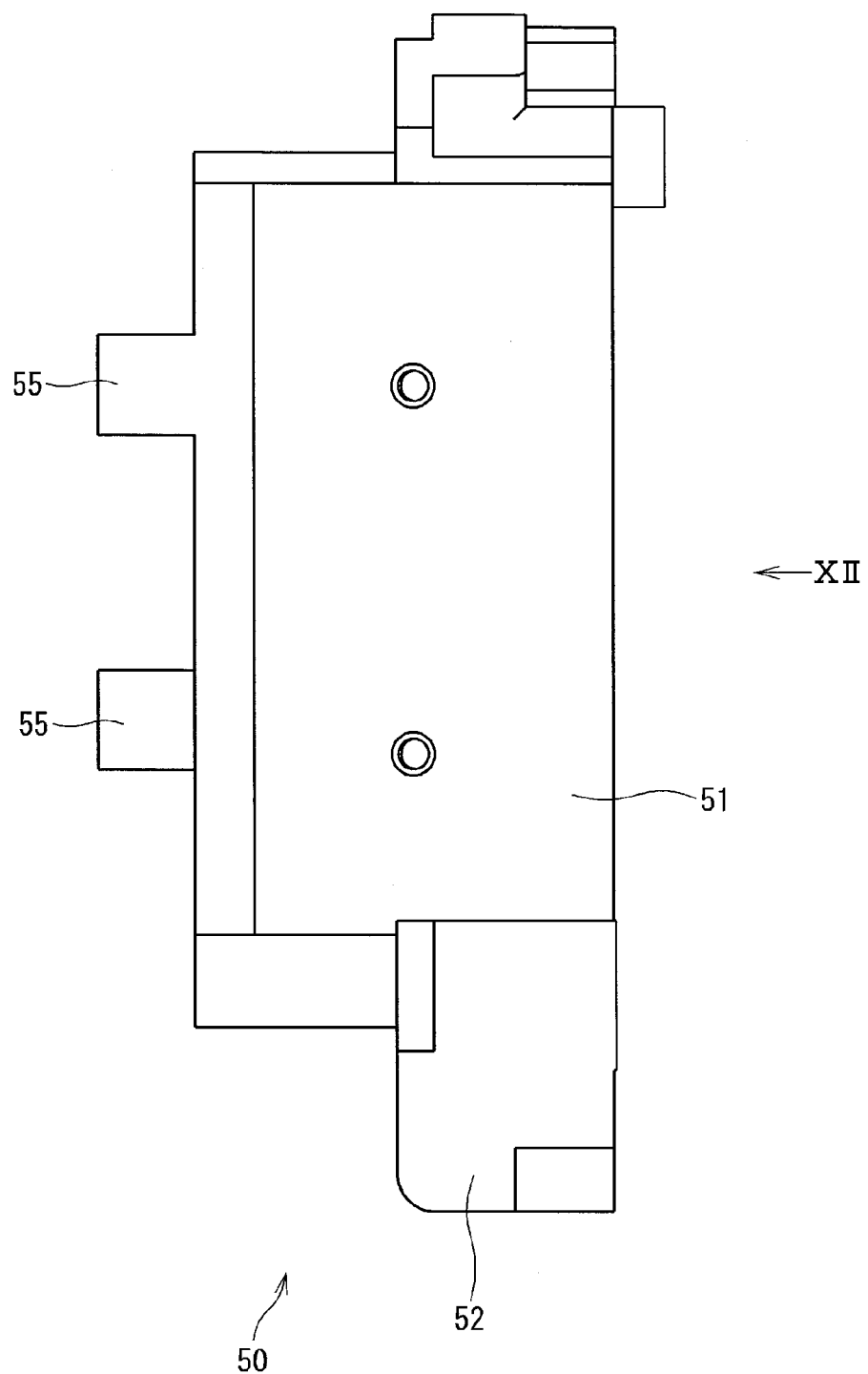
FIG. 11 is a side view of the heat sink shown in FIG. 10.
Figure 12:
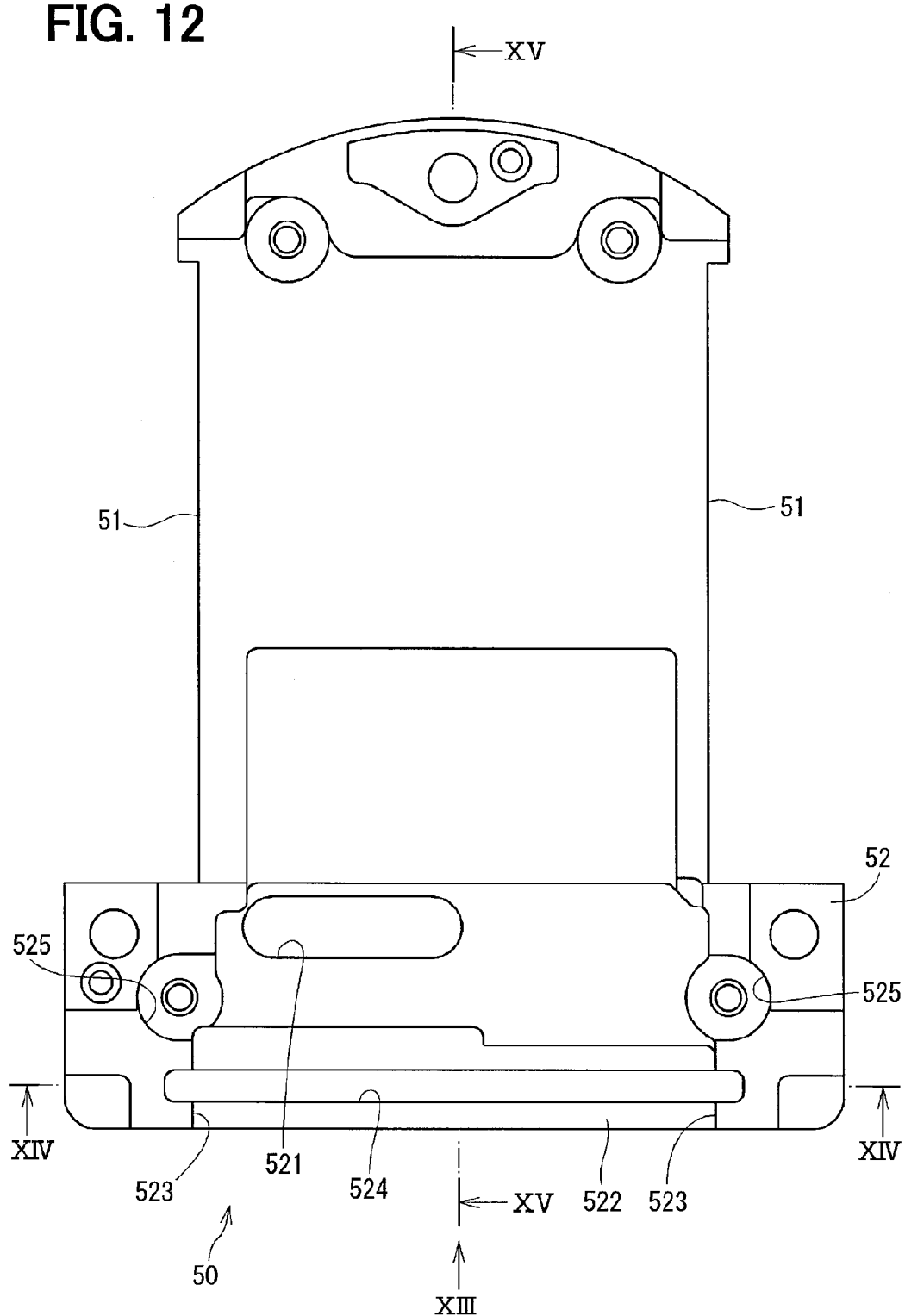
FIG. 12 is a bottom view of the heat sink taken in an arrow direction XII in FIG. 11.
Figure 13:
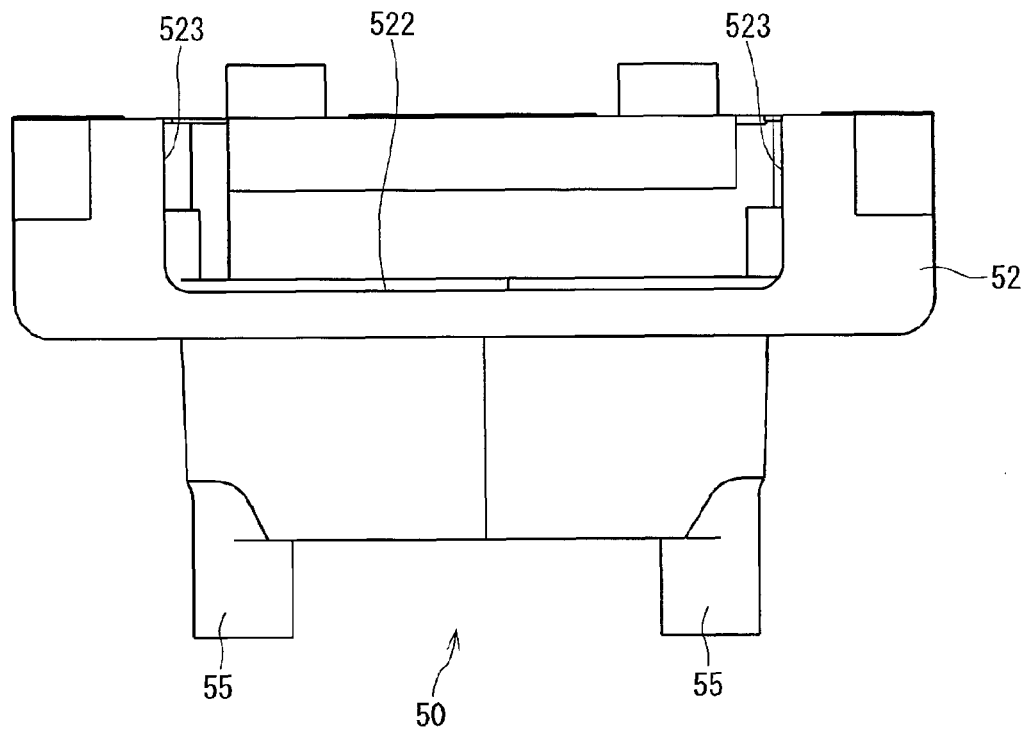
FIG. 13 is a side view of the heat sink taken in an arrow direction XIII in FIG. 12.
Figure 14:
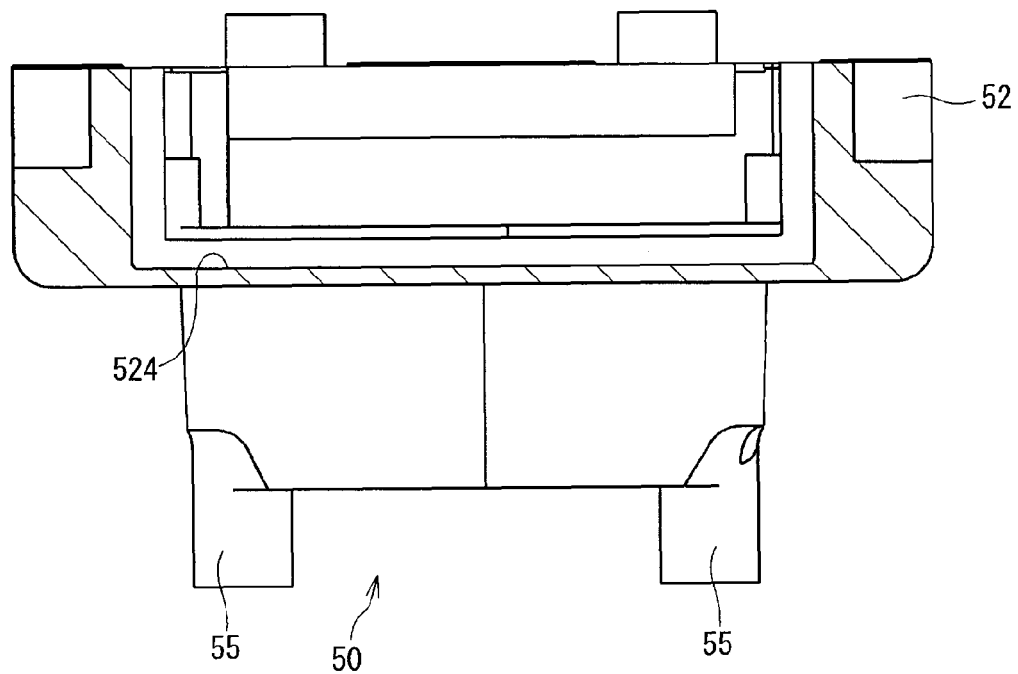
FIG. 14 is a sectional view of the heat sink taken along a line XIV-XIV in FIG. 12.
Figure 15:
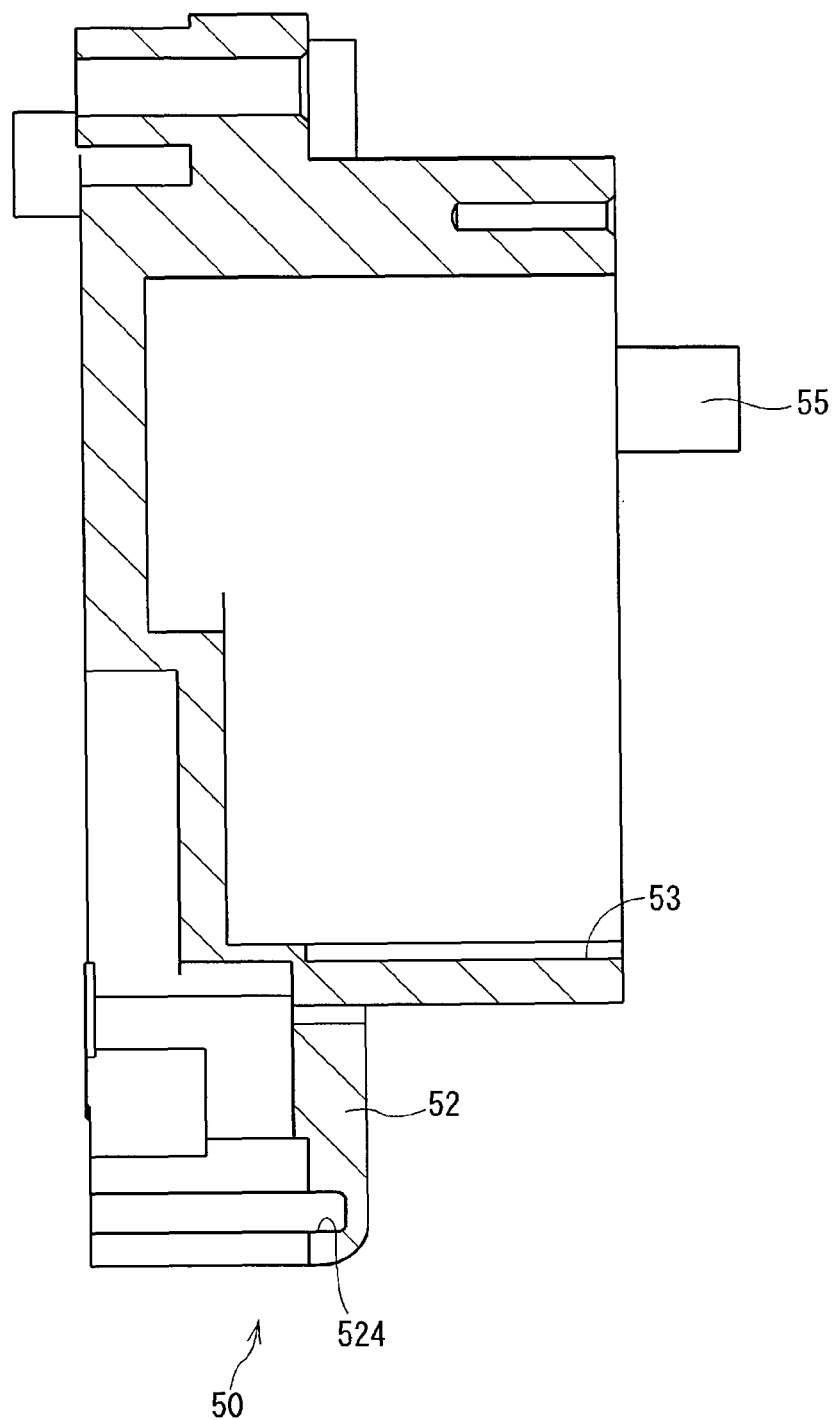
FIG. 15 is a sectional view of the heat sink taken along a line XV-XV in FIG. 12.
Figure 16:
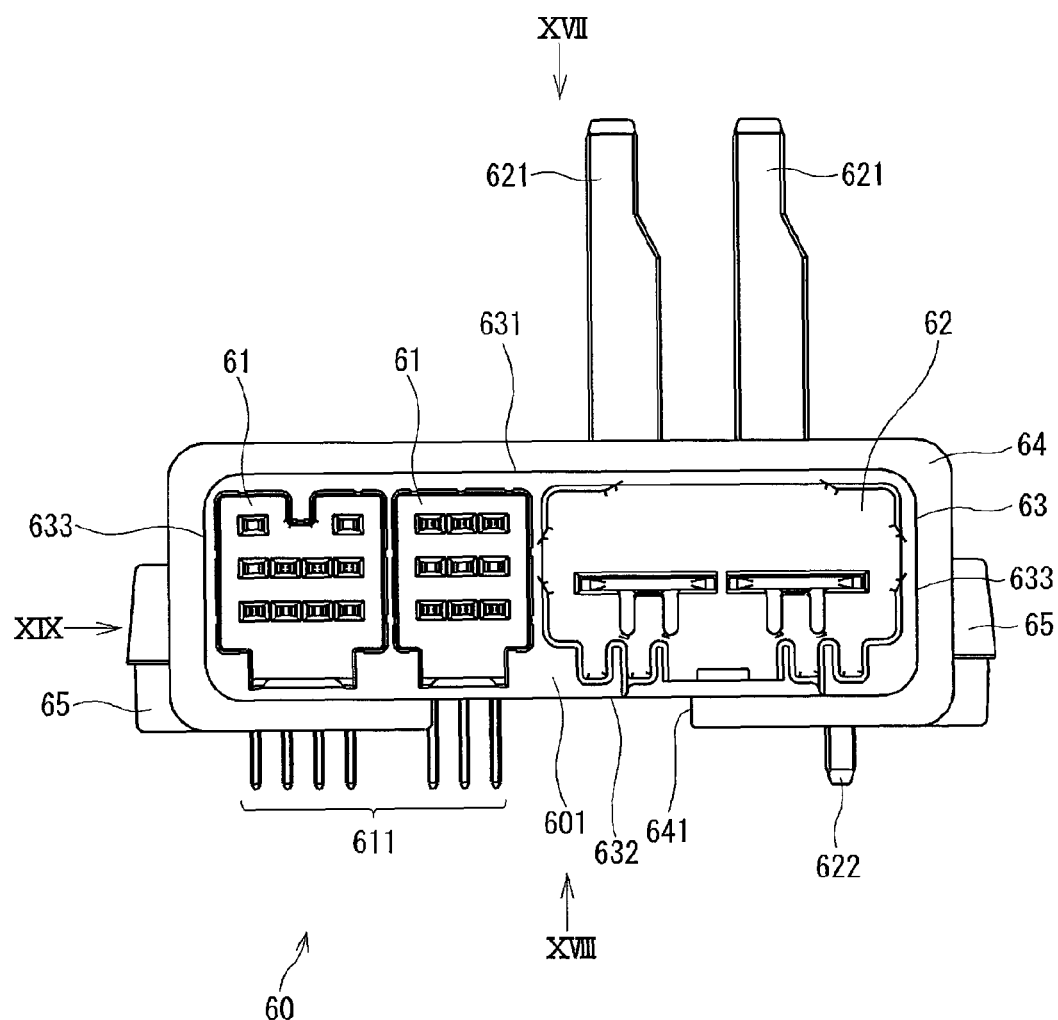
FIG. 16 is a front view of a connector provided in the drive apparatus.
Figure 17:
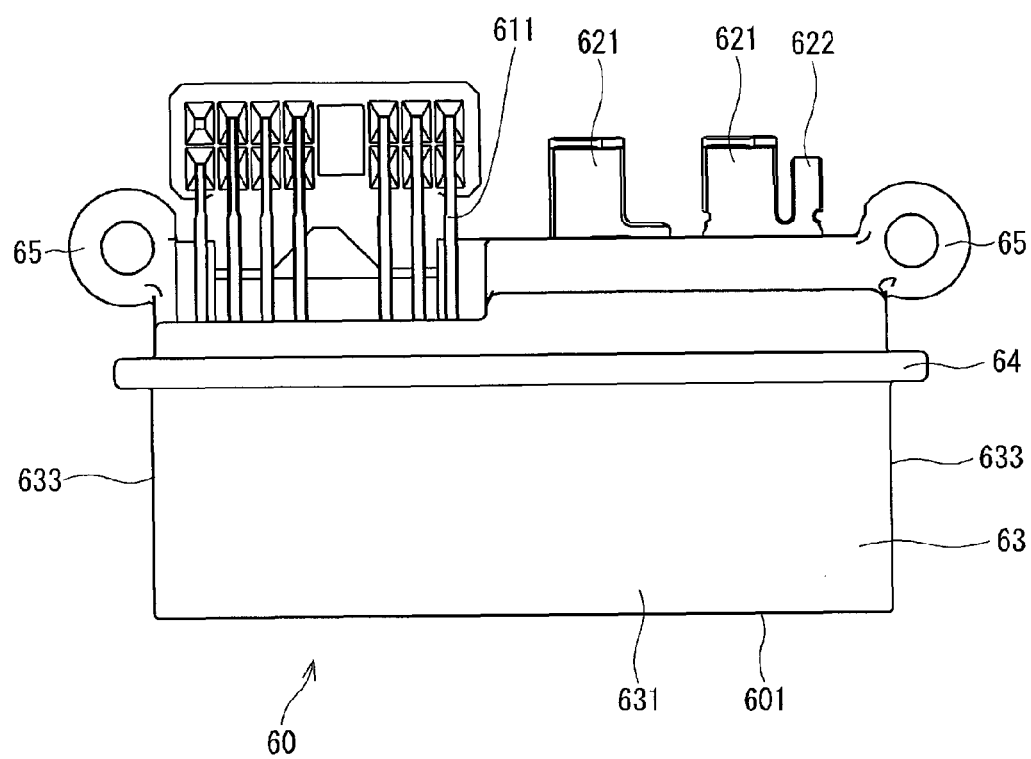
FIG. 17 is a top view of the connector taken in an arrow direction XVII in FIG. 16.
Figure 18:
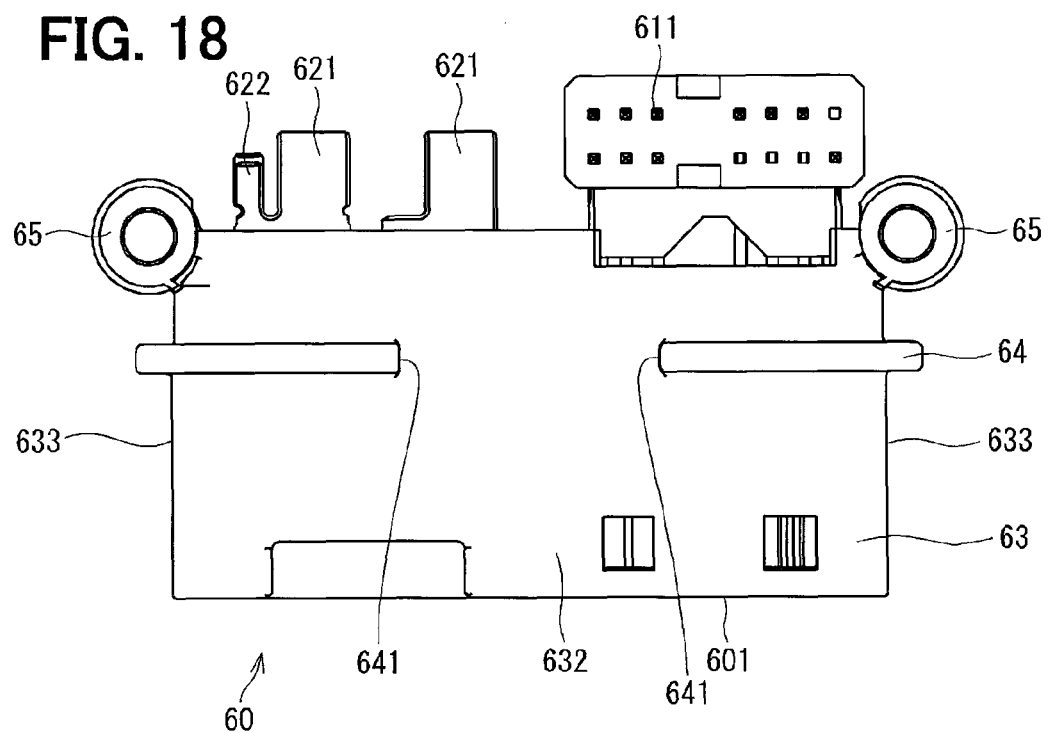
FIG. 18 is a bottom view of the connector taken in an arrow direction XVIII in FIG. 16.
Figure 19:
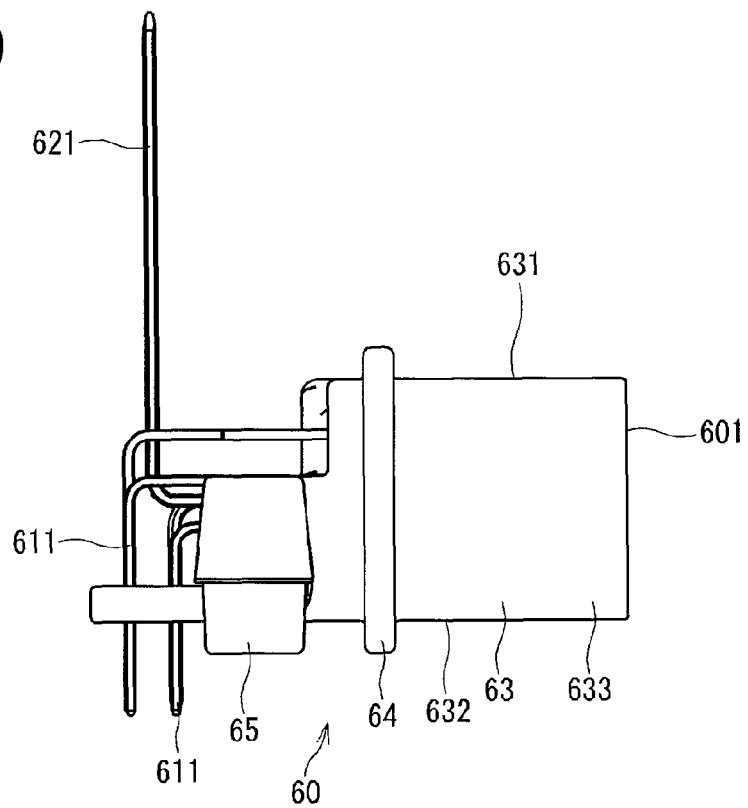
FIG. 19 is a side view of the connector taken in an arrow direction XIX in FIG. 16.

The heat sink 50 will be described next with reference to FIG. 2, FIG. 7 and FIG. 9 to FIG. 15. The perspective view of FIG. 10 shows a state, which is viewed from the motor 2 side (bottom side). The heat sink 50 is made of a good heat conductive material such as aluminum. It includes module holding parts 51, a connector holding part 52, an accommodation recess part 53, female screw parts 55 and the like. The module holding parts 51 are provided to oppose the lead wires 151 and in a direction to rise from the rear end frame 18 of the motor 2. Two module holding parts 51 are formed generally in parallel to hold two power modules 40.

The accommodation recess part 53 is formed to open toward the power circuit board 31 side. In the space inside the accommodation recess part 53, the choke coil 76 and the capacitors 77, 78, which are mounted on the heat sink 50 side of the power circuit board 31 are accommodated. The female screw parts 55 are formed on the opposite side to the motor 2 and inserted in insertion holes 35 formed in the power circuit board 31. Thus the power circuit board 31 is placed in position relative to the heat sink 50.

The heat sink 50 is screw-fixed to the rear end frame 18 of the motor 2 by the screws 59. Thus the control unit 3 is assembled to be integral with the motor 2. The connector holding part 52 will be described later.

The cover member 70 is provided at an end part of the control unit 3, which is on the opposite side to the motor 2. The cover member 70 accommodates therein the control wiring part 20, the power wiring part 30, the power module 40 and the heat sink 50. The cover member 70 is provided with a connector cover part 71, which is formed to protrude radially outwardly. The connector cover part 71 is formed in a shape, which corresponds to the connector holding part 52. An opening 72 is formed in the connector cover part 71 so that the connector 60 protrudes therethrough.

Screw holes 73 are formed on the top of the cover member 70. Screws 74 are inserted in the screw holes 73 and threaded into the female screw parts 55 of the heat sink 50. Thus the cover member 70 is held by the heat sink 50 and prevents water droplets and the like from entering into the control unit 3 from the opposite side of the motor 2, that is, from the top side of the drive apparatus 1.

As shown in FIG. 16 to FIG. 19, the connector 60 is formed in a generally rectangular box shape and used for electrical connection with outside parts. The connector 60 is formed of a control connector part 61 and a power connector part 62 integrally. The control connector part 61 is configured to enable wires to be connected from the open end 601 side of the connector 60. Thus the control connector part 61 is connected to the torque sensor 8, CAN and the like through the wires to receive various signals. Control connection terminals 611 are provided on a side opposite to the open end 601 of the control connector part 61 (referred to as a deep part side). The control connection terminals 611 are inserted in holes 23 formed in the control circuit board 21 and electrically connected by soldering or the like. Thus various information is inputted to the control circuit board 21 from CAN and the like.

The power connector part 62 is configured to enable wires to be connected from the open end 601 side of the connector 60. Thus the power connector part 62 is connected to the power source 75 (FIG. 1) through the wires to supply power from the power source 75. Power connection terminals 621 are provided on the deep part side (radially inside part) of the power connector part 62. The power connection terminals 612 are inserted in power connection terminal holes 521 of the heat sink 50, which will be described later, and taken out toward the power circuit board 31 side. The power connection terminals 621 are inserted in the holes 32 formed in the power circuit board 31 and electrically connected by soldering or the like. Thus, the power supplied from the power source 75 is supplied to the winding set 13, through the connector 60, the power circuit board 31, the power module 40 and the lead wires 131. A ground terminal 622 is provided on the deep part side of the power connector part 62. The ground terminal 622 is inserted in holes 24 formed in the control circuit board 21 and electrically connected by soldering or the like. Thus the control circuit board 21 is grounded surely.

A peripheral wall 63 of the connector 60 is formed of a first surface 631, a second surface 632 and side surfaces 633. The first surface 631 is opposite to the motor 2. The second surface 632 is on a same side as the motor 2. The side surfaces 633 are formed of two surfaces provided on both sides of the first surface 631 and connect the first surface 631 and the second surface 632. The peripheral wall 63 is provided with a flange 64 as a first fitting part, which protrudes outwardly. The flange 64 is formed over the first surface 631, the side surfaces 633 and a part of the second surface 632. A cutout part 641 is provided on the second surface 632. The cutout part 641 is provided at a generally central part on the second surface 632 not to interfere with heads of the through bolt 19.

Here, the connector holding part 52 will be described with reference to FIG. 10 to FIG. 15. The connector holding part 52 is formed to protrude in the radially outward direction to cover the connector 60 and hold the connector 60. A power connection terminal hole 521, a fitting groove 524 as a second fitting part, a column recess part 525 and the like are provided on the connector holding part 52. The power connection terminal holes 521 are formed in an elongated circular shape when viewed in the axial direction. The power connection terminals 621 of the connector 60 are inserted in the power connection terminal holes 521 and taken out toward the power circuit board 31 side.

The connector holding part 52 is formed to be open toward the motor 2 side with its accommodation bottom part 522 and accommodation side parts 523 formed in a generally U-shape. The fitting hole 524 is formed to extend on the accommodation bottom part 522 and the accommodation side parts 523 of the connector holding part 52. The fitting groove 524 is in a shape, which corresponds to the flange 64 formed on the first surface 631 and the side surfaces 633 of the connector 60.

In assembling the connector 60 to the heat sink 50, the connector 60 is inserted from the motor 2 side so that the flange 64 of the connector 60 is fitted in the fitting groove 524. After the connector 60 is assembled to the heat sink 50, the accommodation bottom part 522 faces the first surface of the connector 631 and the accommodation side parts 523 face the side surfaces 633 of the connector 633.

Column recess parts 525 are formed in a shape, which correspond to a column 65 provided on the side surface 633 of the connector 60. The connector 60 is positioned relative to the heat sink 50 by fitting of the column 65 and the column recess part 525. The screw 29 is inserted in the screw hole formed on the connector 60 side of the control circuit board 21 and the column 65 and screw-fitted to the heat sink 50. Thus, the connector 60 is tightened to the heat sink 50 at two positions together with the control circuit board 21 and held by the heat sink 50.

Figure 20:
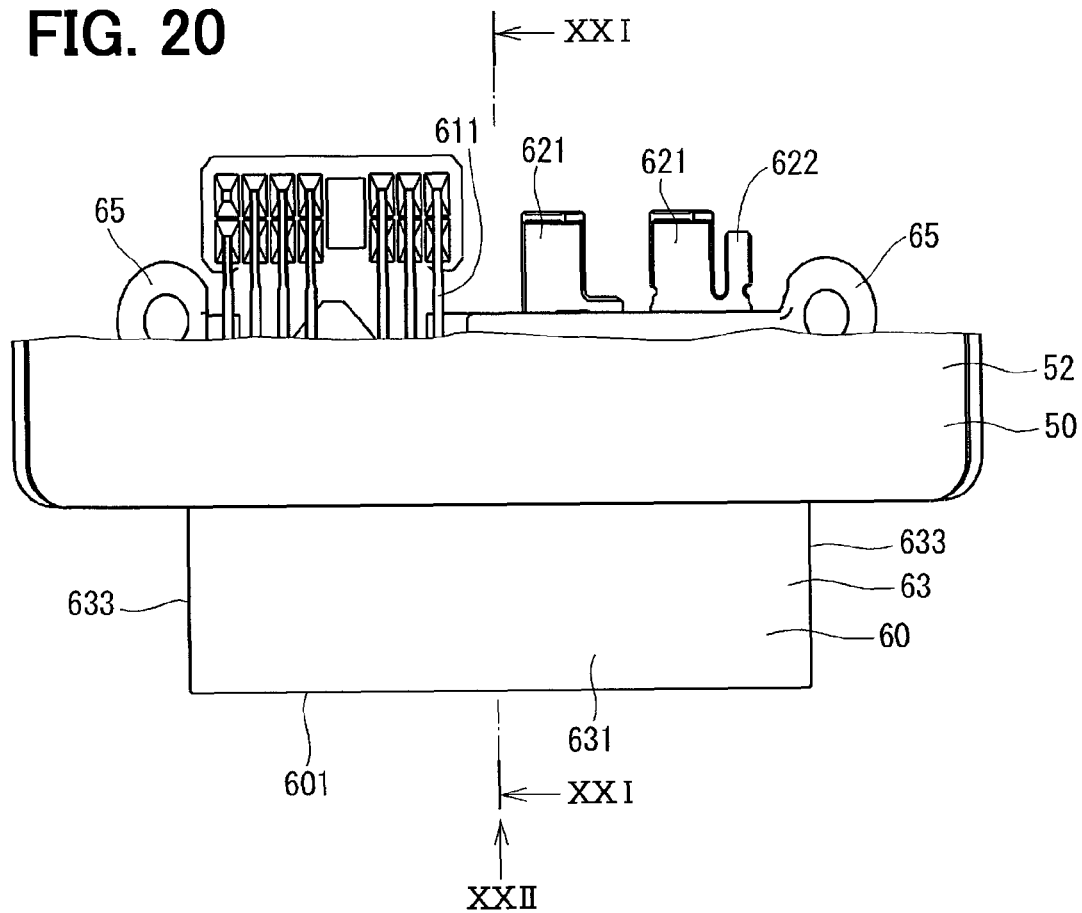
FIG. 20 is a top view showing an assembly of the heat sink, the connector and a rear end frame in the drive apparatus.
Figure 21:
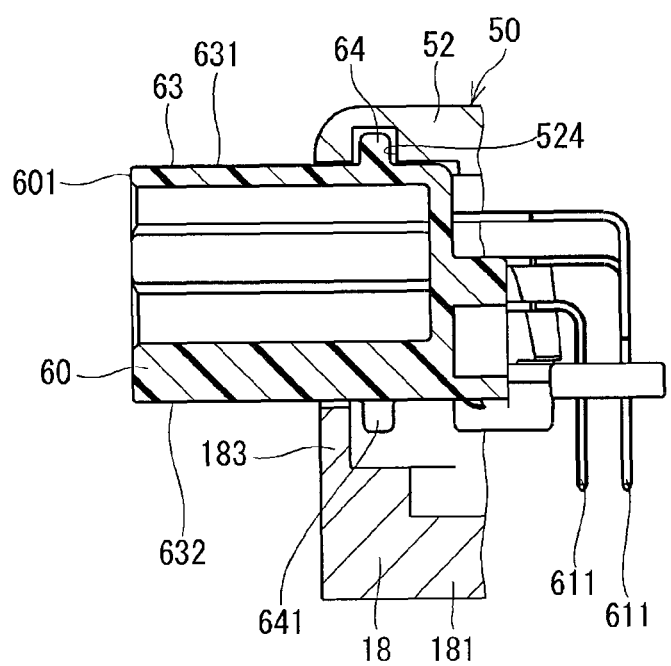
FIG. 21 is a sectional view of the connector taken along a line XXI-XXI in FIG. 20.
Figure 22:
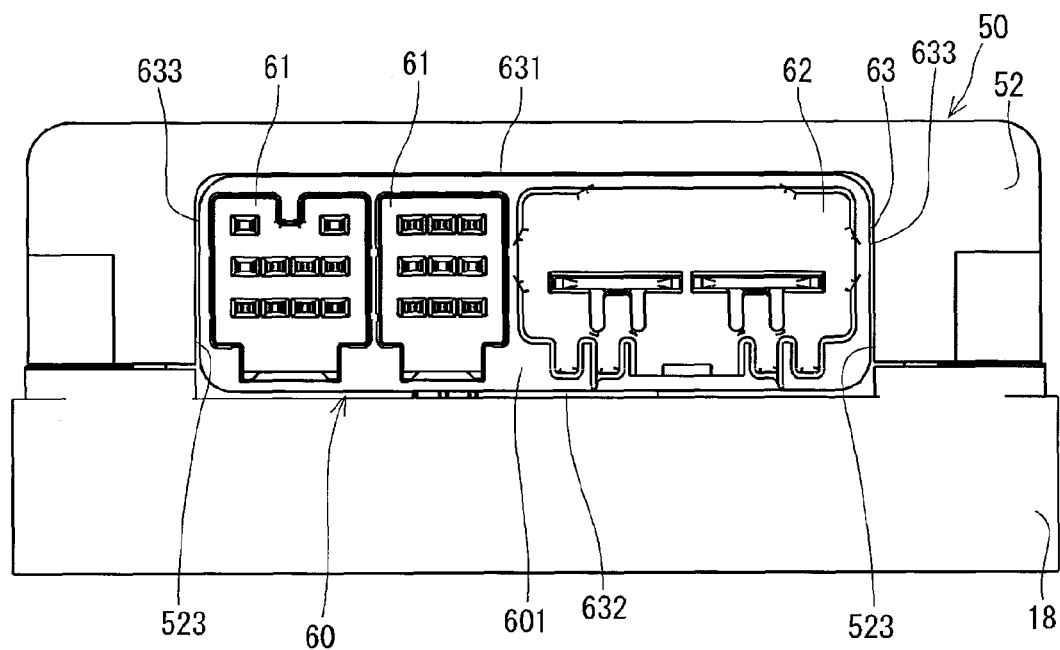
FIG. 22 is a front view of the connecter taken in an arrow direction XXII in FIG. 20.
Figure 23:
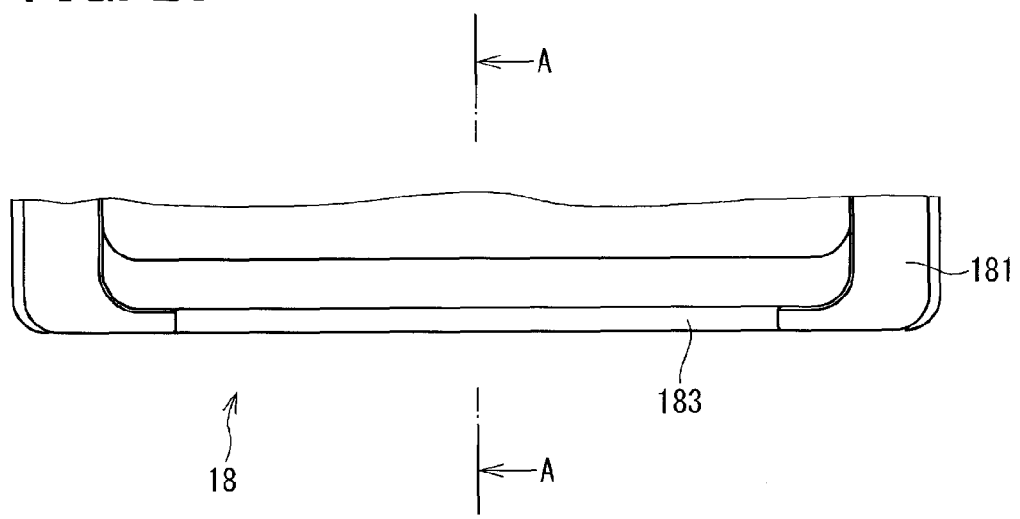
FIG. 23 is a plan view showing a part of the rear end frame of the drive apparatus.
Figure 26:
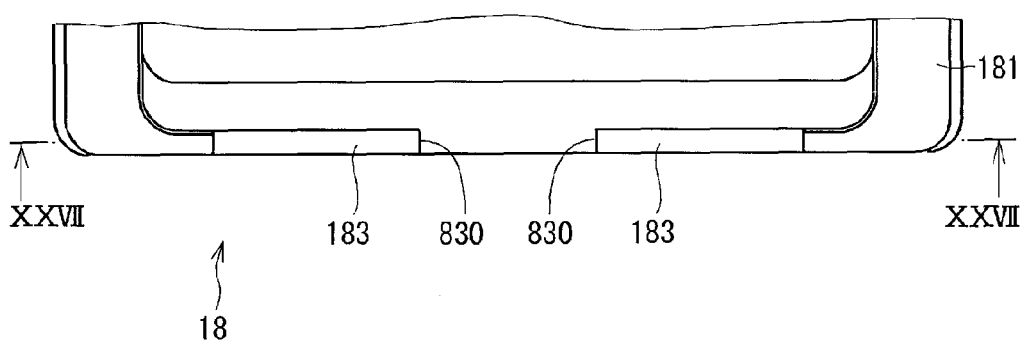
FIG. 26 is a plan view of the rear end frame in the drive apparatus according to a fourth embodiment.

FIG. 20 to FIG. 22 show a state of assembly of the heat sink 50, the connector 60 and the rear end frame 18. FIG. 21 corresponds to FIG. 3, in which parts other than the heat sink 50, the connector 60 and the rear end frame 18 are removed. FIG. 23 shows only the rear end frame 18 in correspondence to FIG. 20. The A-A line in FIG. 23 corresponds to the XXI-XXI line in FIG. 20. In FIG. 23, a curved part, which corresponds to the through bolt 19, is shown schematically as a linear shape. FIG. 26 is illustrated in the similar manner as FIG. 23.

As shown in FIG. 21 and the like, the rear end frame 18 is arranged on the second surface 632 side of the connector 60. The first wall part 183, which is formed outside the flange 64, is provided in the connector receiving part 181 of the rear end frame 18. Thus, water droplets are restricted from entering into a space between the motor 2 and the control unit 3.

As described above in detail, the drive apparatus 1 according to the first embodiment includes the power module 40, the connector 60 and the heat sink 50. The power module 40 includes the FETs 81 to 86. The connector 60 is used for electric connection with the outside parts and has the flange 64 formed on the peripheral wall 63. The heat sink 50 includes the module holding part 51, which holds the power module 40, and the connector holding part 52, which is formed with the fitting groove 524 to be fitted with the flange 64 for holding the connector 60. The flange 64 is formed along the first surface 631 of the peripheral wall 63, which opposes the accommodation bottom part 522 of the connector holding part 52, and the side surfaces 633 formed on both sides of the first surface 631.

The connector holding part 52 is provided in the heat sink 50, which holds the power module 40, so that the flange 64, which is formed along the first surface 631 of the peripheral wall 63 of the connector 60 and the side walls 633, and the fitting groove 524, which is formed in the heat sink are fitted each other. Thus, without adding other members such as a water-preventing cover, it is possible to restrict water droplets from entering in the drive apparatus 1, particularly the control unit 3, through the clearance between the connector 60 and the heat sink 50. Thus the drive apparatus 1 is made to be water-proof.

The motor 2, which is connected electrically to the power module 40 and the connector 60, is provided integrally on the second surface of the connector 60, which is opposite to the first surface 631. The drive apparatus 1 is formed by integrating the control unit 3, which includes the power module 40, the heat sink 50, the connector 60 and the like, and the motor 2. Particularly, the drive apparatus 1 is used in the EPS. The drive apparatus 1 hence need be mounted near the column shaft 6, at which the space for mounting is limited. Since the drive apparatus 1 has the water-proof structure, it can be mounted even in a place, where water drops fall, for example, under air-conditioner ducts in a vehicle compartment. It is preferable that the drive apparatus 1 is mounted such that the open end 601 is directed more downward than the horizontal plane to restrict water droplets from entering inside the connector 60 and the like through the open end 601 side.

The drive apparatus 1 further includes the cover member 70, which accommodates the power module 40 and the heat sink 50 therein. This cover member 70 thus restricts dust and water droplets from entering into the drive apparatus from the side opposite to the motor 2.

The first fitting part is the flange 64 formed to protrude on the peripheral wall 63 of the connector 60 and the second fitting part is the fitting groove 524 formed in the connector holding part 52 in correspondence to the flange 64. That is, the first fitting part is formed to be in a convex shape and the second fitting part is formed to be in a concave shape. Water droplets, which fall from the cover member 70 side, flow on the outer surface of the flange 64 fitted with the fitting groove 524. The water droplets are thus restricted from entering into the control unit 3 through the clearance between the heat sink 50 and the connector 60.

The rear end frame 18 is provided between the first surface 631 of the connector 60 and the second surface 632 on the opposite side. The first wall part 183 is formed outside the flange 64 at places, which oppose the connector 60 of the rear end frame 18. Thus water droplets are thus restricted from intrusion through the clearance between the motor 2 and the control unit 3.

Second Embodiment

Figure 24:
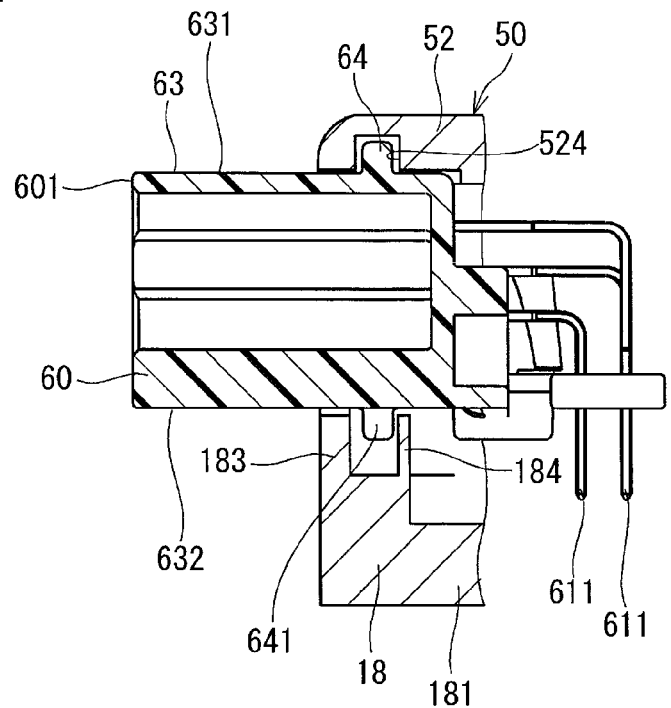
FIG. 24 is a sectional view showing an assembly of the heat sink, the connector and the rear end frame in the drive apparatus according to a second embodiment.

A second embodiment is different from the first embodiment only in the rear end frame 18. Hence only this difference will be described. The rear end frame 18 is shown in FIG. 24, which corresponds to FIG. 21. At locations of the rear end frame 18, which oppose the connector 60, not only the first wall part 183 formed radially outside the flange 64 but also a second wall part 184 formed radially inside the flange 64 are provided. The first wall part 183 and the second wall part 184 are formed to have generally the same height in the axial direction.

The first wall part 183 formed outside the flange 64 and the second wall part 184 formed inside the flange 64 are provided on the rear end frame 18. Thus it is possible to restrict water droplets from intruding through the clearance between the motor 2 and the control unit 3. The second embodiment provides the similar advantage as the first embodiment.

Third Embodiment

Figure 25:
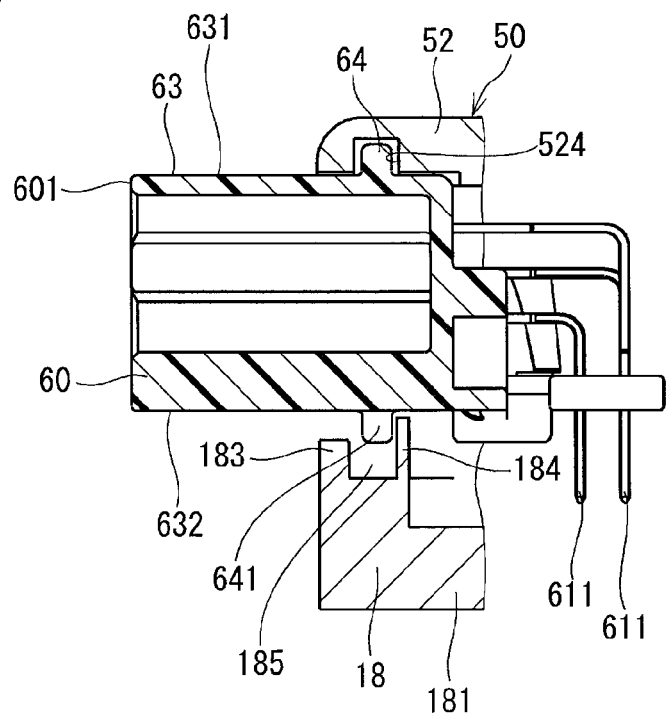
FIG. 25 is a sectional view showing an assembly of the heat sink, the connector and the rear end frame in the drive apparatus according to a third embodiment.

A third embodiment is a variation example of the second embodiment. The third embodiment, particularly the rear end frame 18, will be described with reference to FIG. 25. Similarly to the second embodiment, the first wall part 183 and the second wall part 184 formed outside the flange 64 are provided on the rear end frame 18. The first wall part 183 is lower than the second wall part 184.

Water droplets falling from the cover member 70 side (top side of FIG. 25) may sometimes flow along the flange 64 and tend to stay in a space between the connector 60 and the rear end frame 18. However, the first wall part 183 is formed to be lower than the second wall part 184. The water collected in a space 185 can therefore be discharged from the first wall 183 side to the outside. It is thus possible to restrict the water droplets from flowing over the second wall part 184 and intruding between the motor 2 and the control unit 3. The third embodiment provides the similar advantage as the above-described embodiments.

Fourth Embodiment

Figure 27:
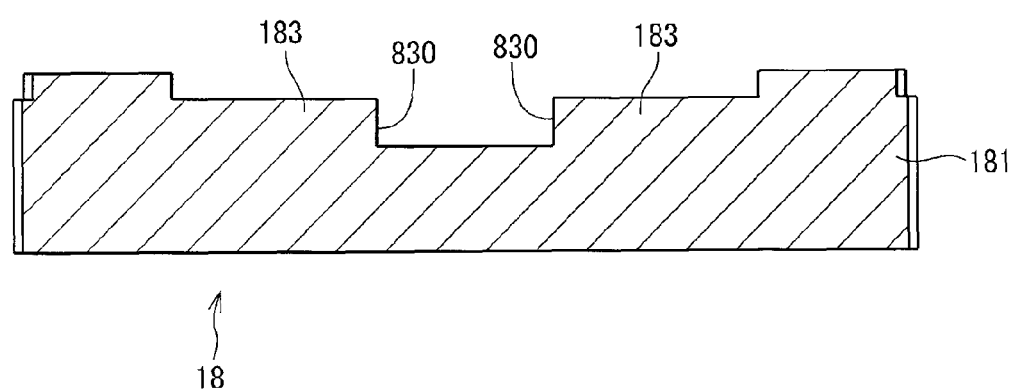
FIG. 27 is a sectional view of the rear end frame taken along a line XXVII-XXVII in FIG. 26.

A fourth embodiment is also a variation example of the second embodiment. The fourth embodiment, particularly the rear end frame 18, will be described with reference to FIG. 26 and FIG. 27. FIG. 26 corresponds to FIG. 23 of the first embodiment. As shown in FIG. 26 and FIG. 27, in the rear end frame 18, a part of the first wall 183 is cut out to form a water drain part 830 for draining the water flowing along the flange 64 or the fitting groove 524 to the outside. With this configuration, similarly to the third embodiment, it is possible to drain the water, which is collected in the space 185, to the outside through the drain part 830 formed in the first wall part 183. It is thus possible to restrict the water droplets from flowing over the second wall part 184 and intruding between the motor 2 and the control unit 3. The fourth embodiment provides the similar advantage as the above-described embodiments.

Fifth Embodiment

Figure 28:
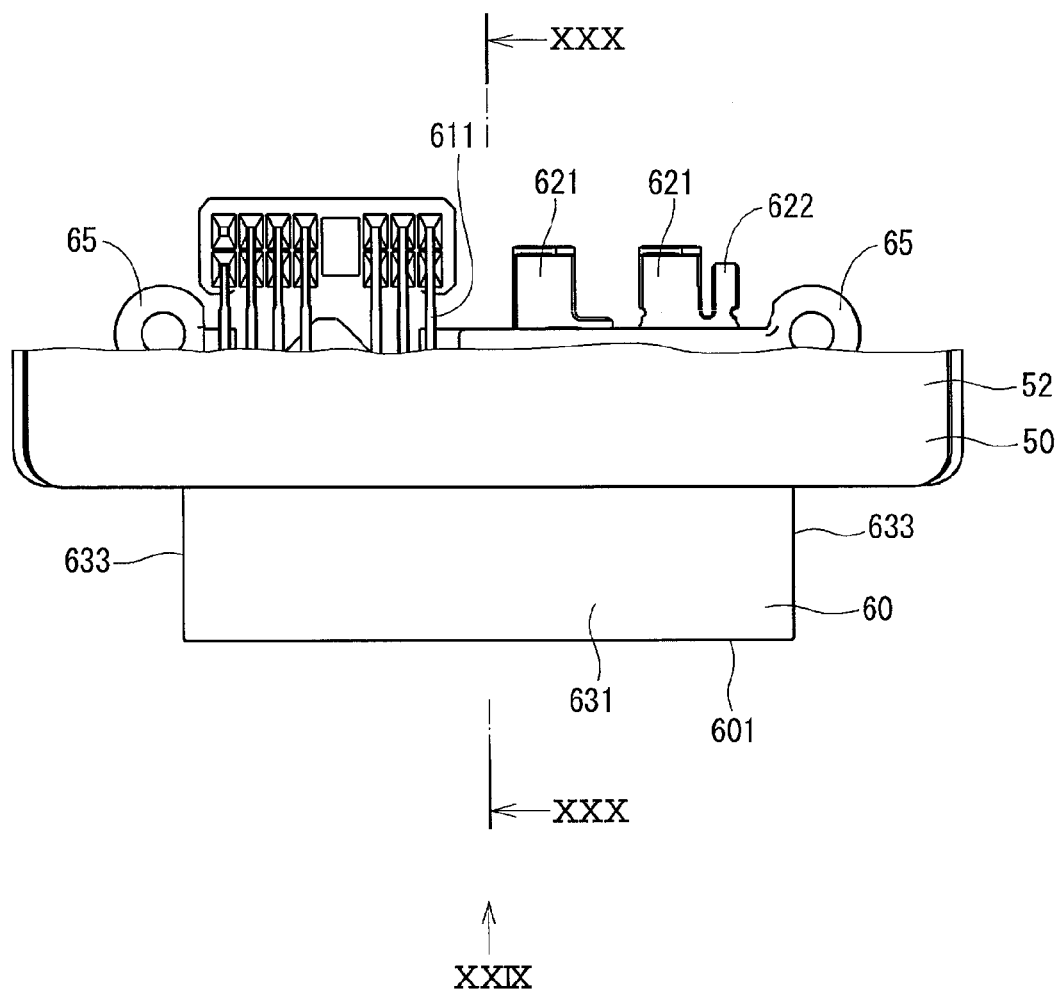
FIG. 28 is a top view showing an assembly of the heat sink, the connector and the rear end frame in the drive apparatus according to a fifth embodiment.
Figure 29:
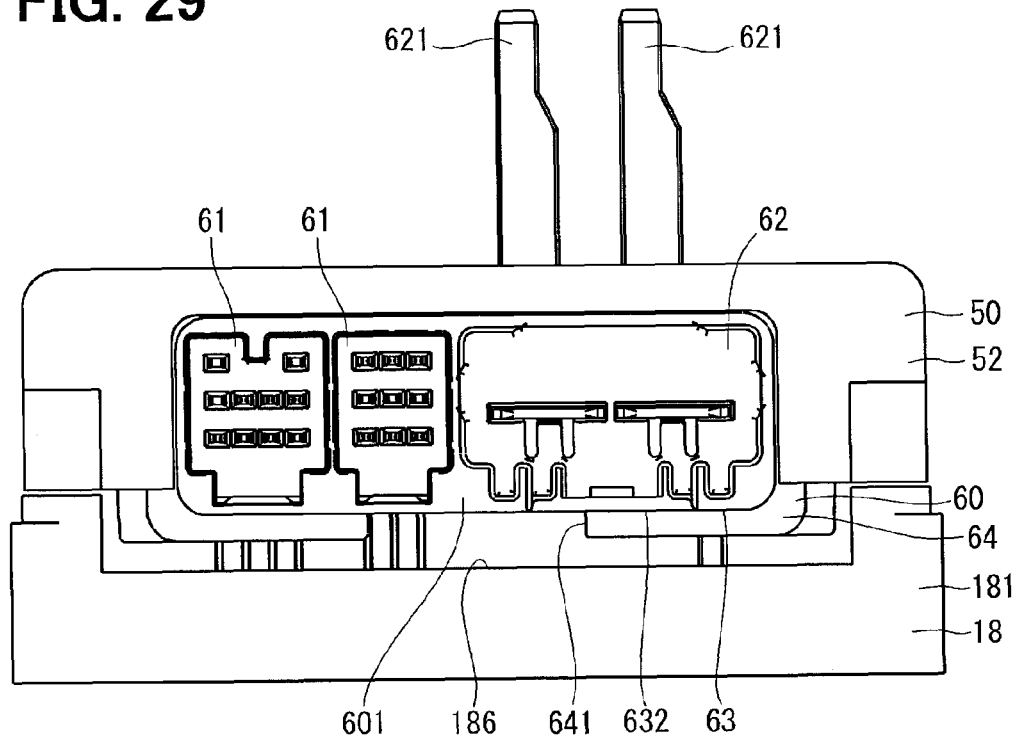
FIG. 29 is a front view of the assembly taken in an arrow direction in XXIX in FIG. 28.
Figure 30:
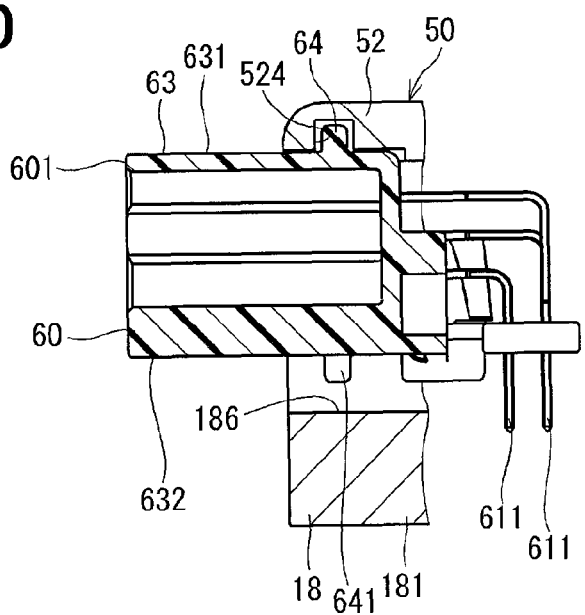
FIG. 30 is a sectional view of the connector taken in an arrow direction XXX-XXX in FIG. 28.

A fifth embodiment is also different from other embodiments only in the rear end frame 18. Hence only this difference will be described. The fifth embodiment, particularly the rear end frame 18, is shown in FIG. 28 to FIG. 30. FIG. 28 corresponds to FIG. 20 of the first embodiment and FIG. 30 corresponds to FIG. 21. A planar part 186 is formed on the rear end frame 18 at a location, which opposes the connector 60. That is, at the location, which opposes the connector 60 of the rear end frame 18, the first wall part 183 and the second wall part 184 of the above described-embodiments are formed. As described above, in a case that the drive apparatus 1 mounted such that the open end 601 of the connector 60 is directed downward in the vertical direction, the rear end frame 18 may be configured as described above. Thus this rear end frame 18 can be simplified. The fifth embodiment provides the similar advantage as the above-described embodiments.

Sixth Embodiment

Figure 31:
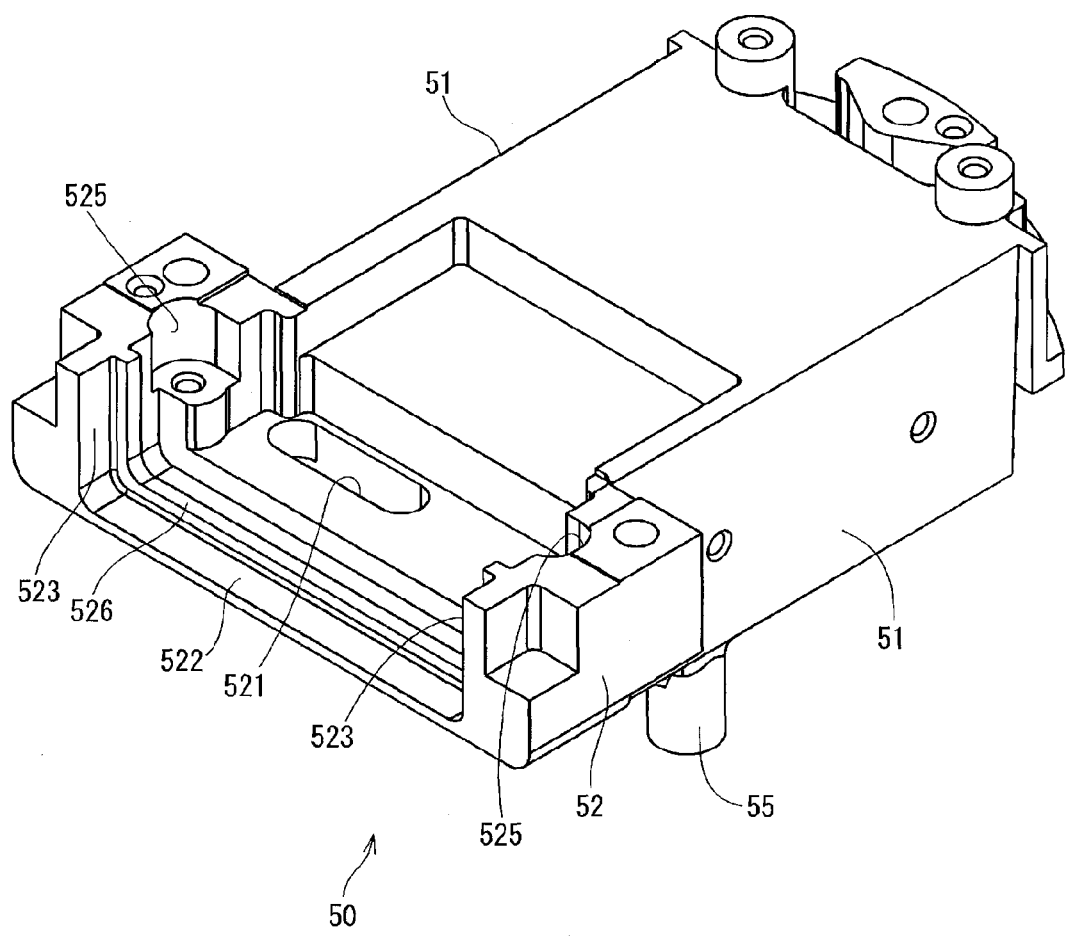
FIG. 31 is a perspective view of the heat sink of the drive apparatus according to a sixth embodiment.

A sixth embodiment is different from the above-described embodiments in the heat sink 50 and the connector 6 and hence only this difference will be described. The sixth embodiment, particularly the heat sink 50 and the connector 60 are shown in FIG. 31 to FIG. 33 and FIG. 34 to FIG. 37, respectively. The perspective view of FIG. 31 shows the state viewed from the motor 2 side (bottom side) as in FIG. 10.

Figure 32:
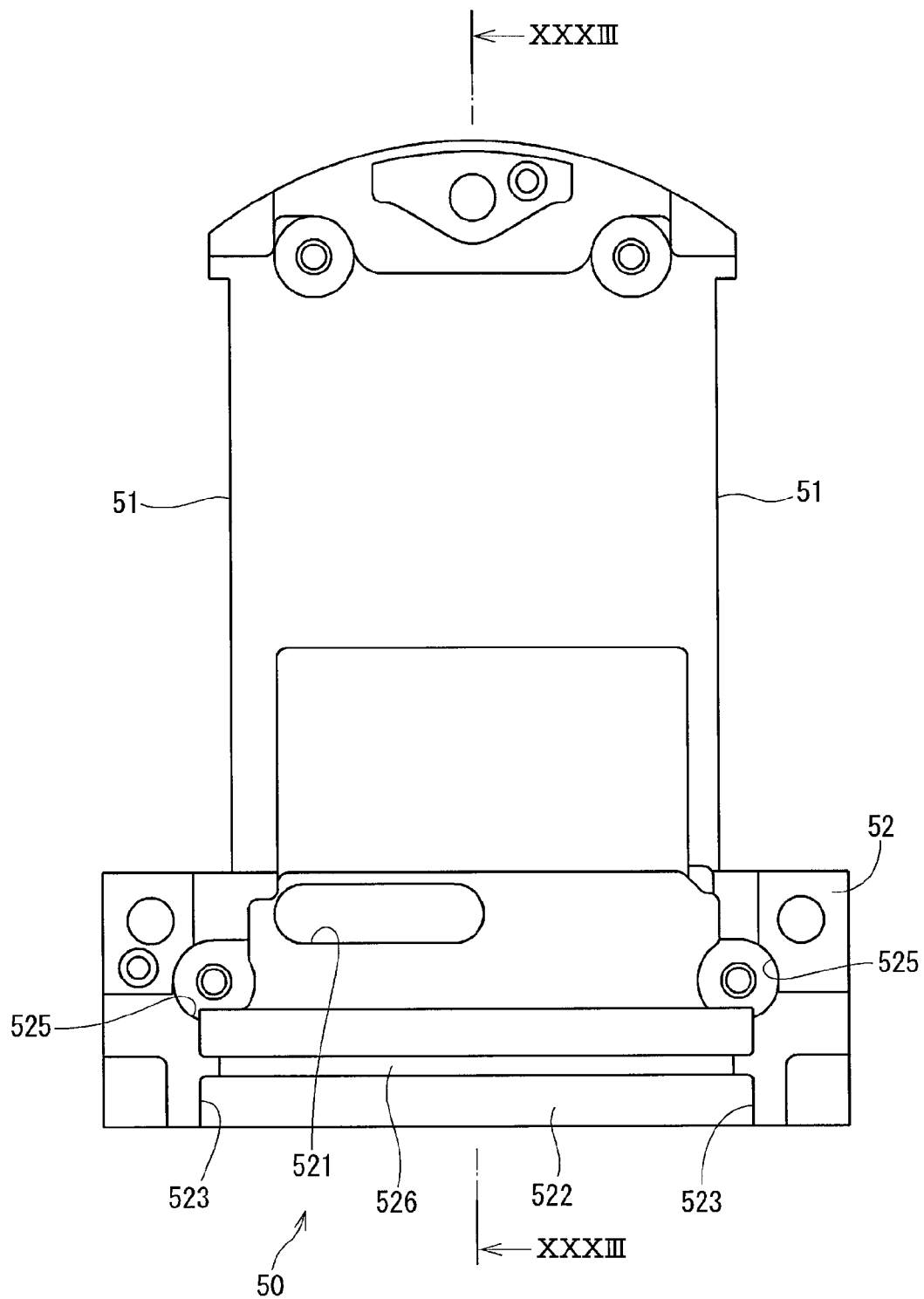
FIG. 32 is a bottom view of the heat sink of the drive apparatus shown in FIG. 31.
Figure 33:
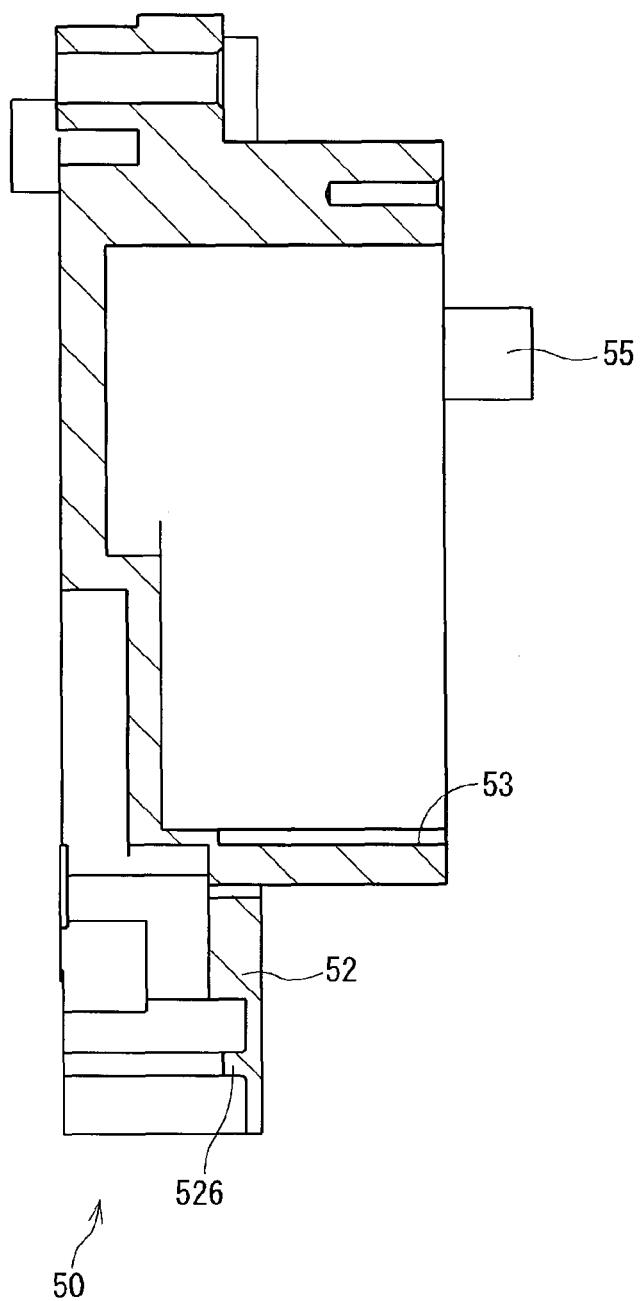
FIG. 33 is a sectional view of the heat sink taken along a line XXXIII-XXXIII in FIG. 33.
Figure 34:
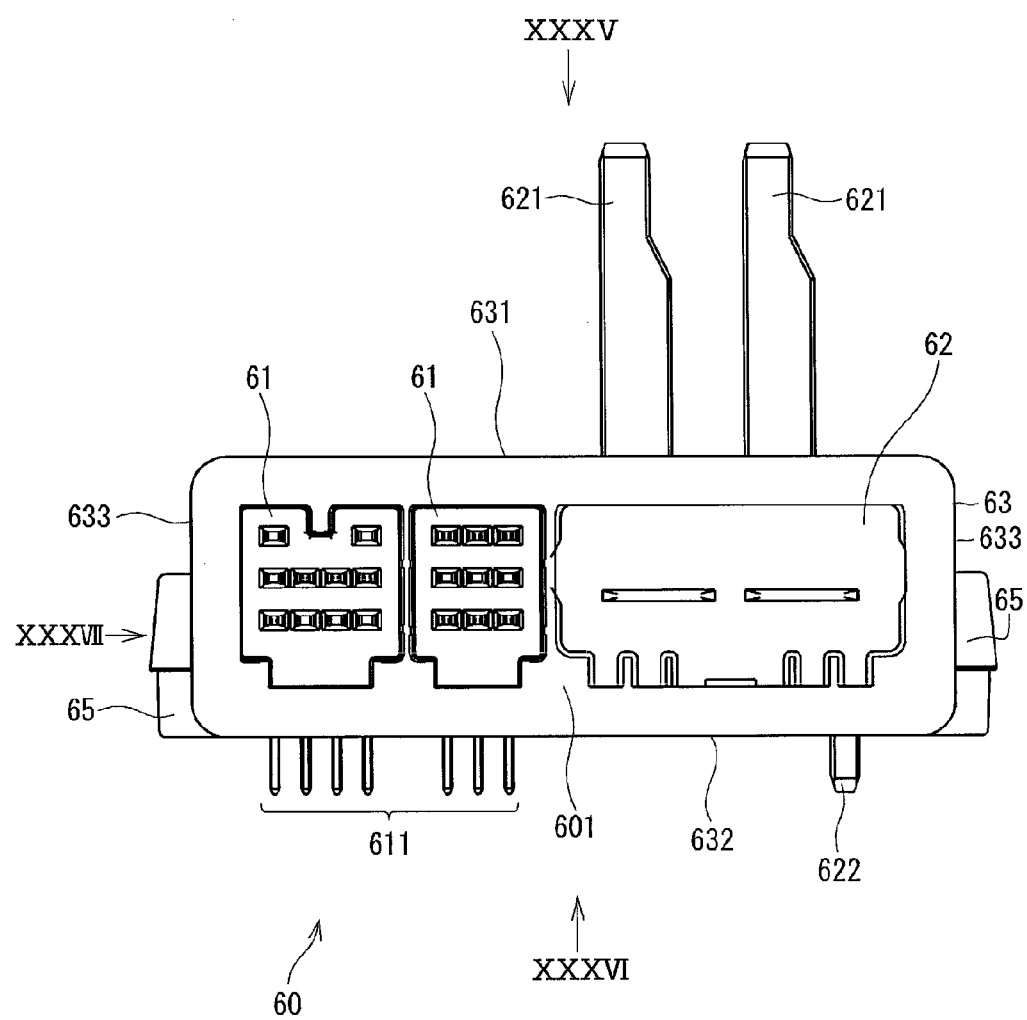
FIG. 34 is a front view of the connector provided in the drive apparatus shown in FIG. 33.
Figure 35:
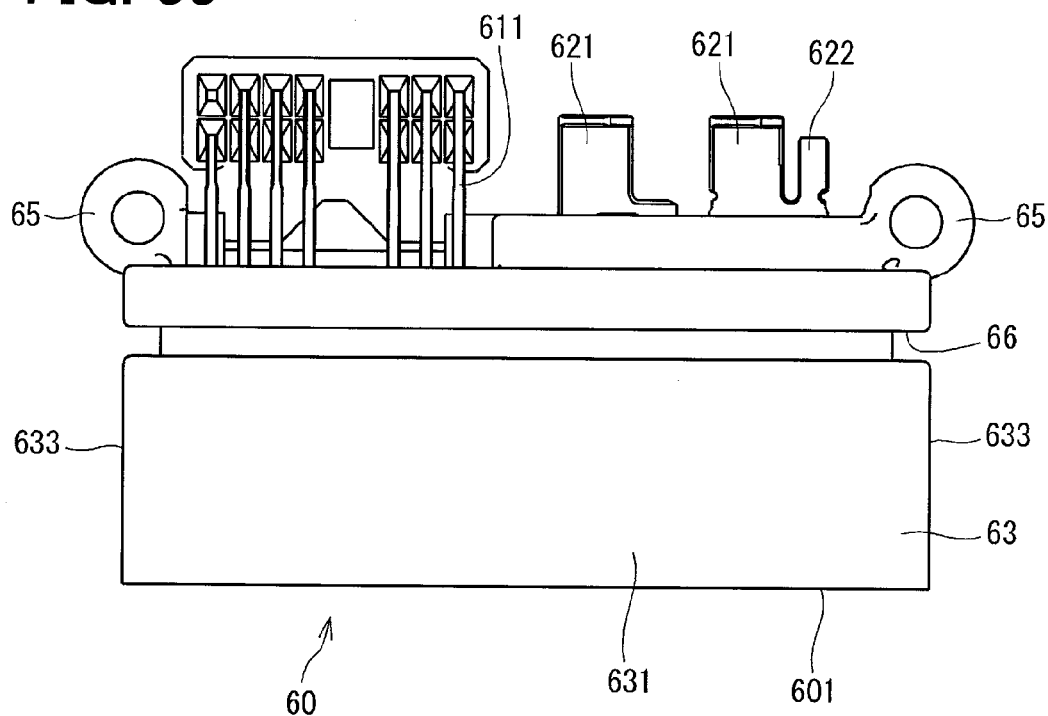
FIG. 35 is a top view of the connector taken in an arrow direction XXXV in FIG. 34.
Figure 36:
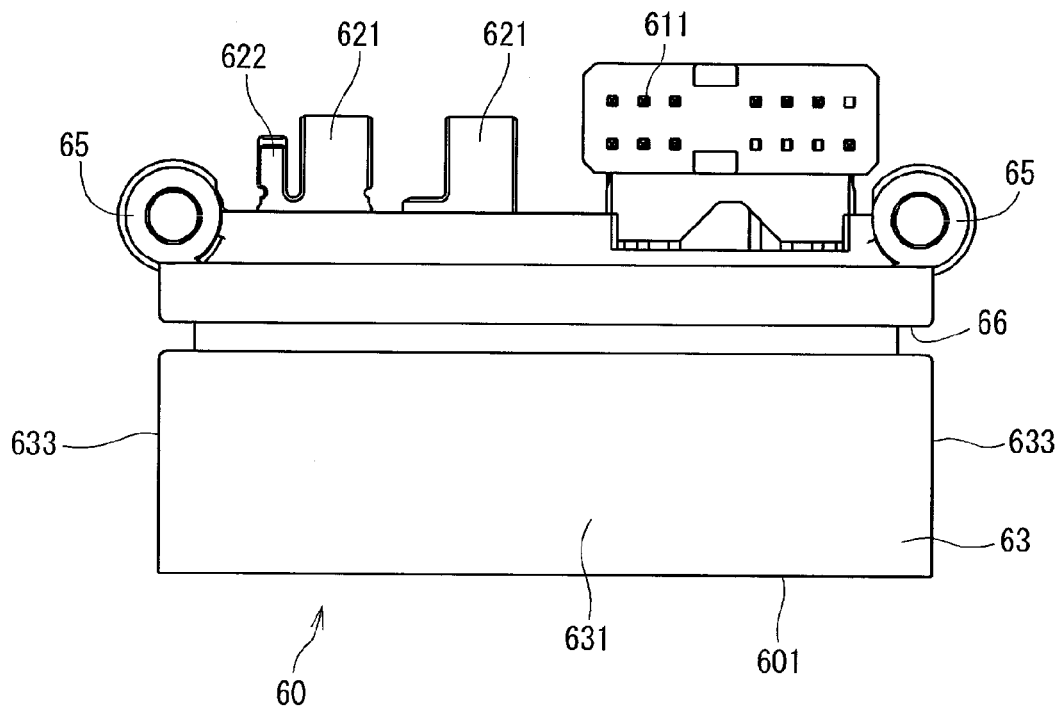
FIG. 36 is a bottom view of the connector taken in an arrow direction XXXVI in FIG. 34.
Figure 37:
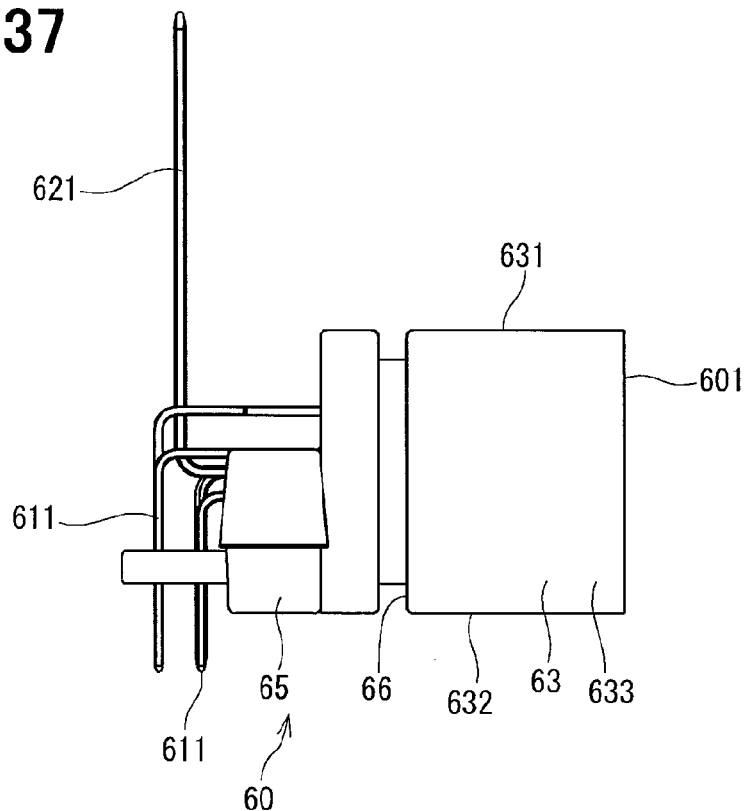
FIG. 37 is a side view of the connector taken in an arrow direction XXXVII in FIG. 34.
Figure 38:
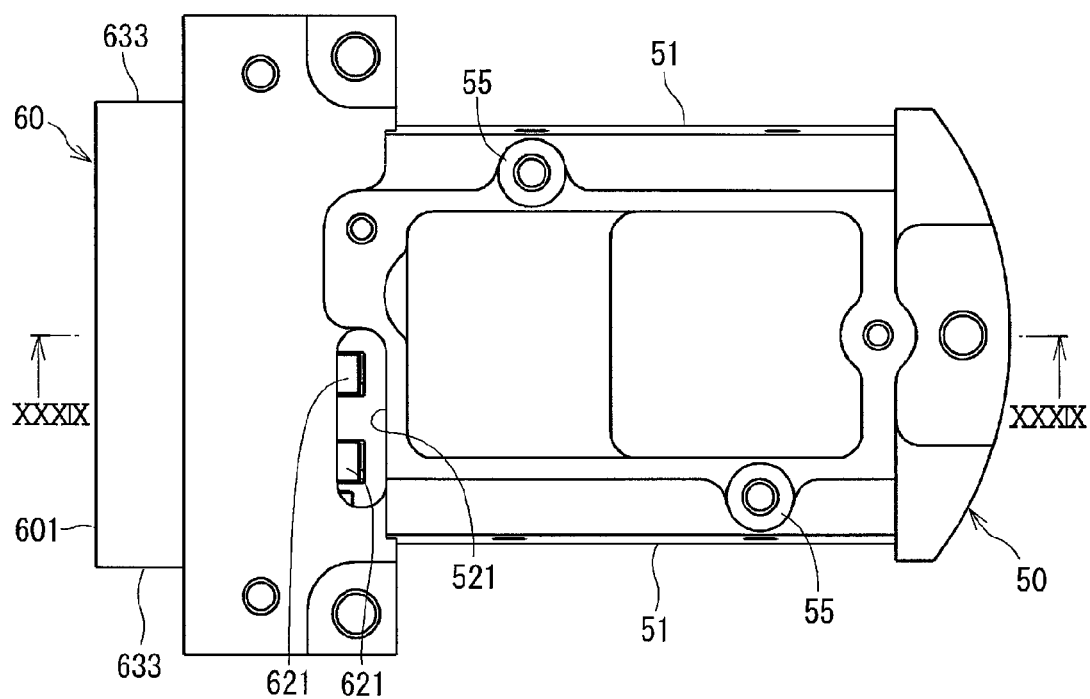
FIG. 38 is a plan view showing an assembly of the heat sink and the connector according to the sixth embodiment.
Figure 39:
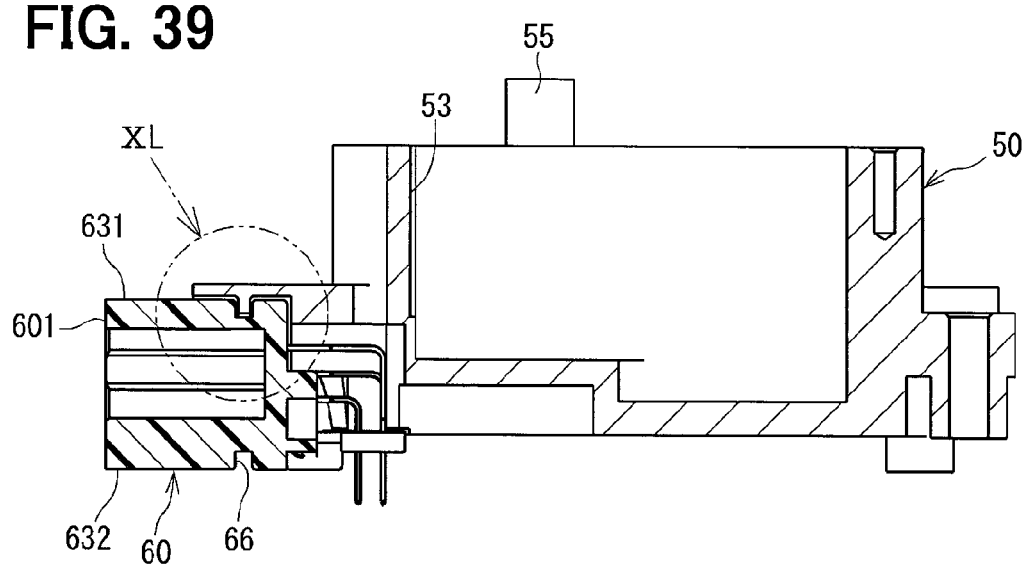
FIG. 39 is a sectional view of the connector taken along a line XXXIX-XXXIX in FIG. 38.

In the above-described embodiments, as exemplarily shown in FIG. 10, the flange 64 is formed in the convex shape as the first fitting part and the fitting groove 524 is formed in the concave shape as the second fitting part. In the sixth embodiment, a fitting concave part 66 is formed as the first fitting part on the peripheral wall 63 of the connector 60 and a fitting convex part 526 is formed as the second fitting part, which corresponds to the fitting concave part 66, on the connector holding part 52 of the heat sink 50. That is, the fitting concave part 66 is formed in the concave shape as the first fitting part and the fitting convex part 526 is formed in the convex shape as the second fitting part. As shown in FIG. 31 to FIG. 33, the fitting convex part 526 is formed on the connector holding part 52 of the heat sink 50. The fitting convex part 526 is formed to extend on the accommodation bottom part 522 and the accommodation side parts 523 of the connector holding part 52.

Further, as shown in FIG. 34 to FIG. 37, the fitting concave part 66 is formed on the peripheral wall 63 of the connector 60 in a shape, which is fitted with the fitting convex part 526. The fitting convex part 66 is formed to extend on the first surface 631, the second surface 632 and the side surfaces 633. That is, the fitting convex part 66 is formed to extend all over the peripheral wall 63 of the connector 60. When the connector 60 is assembled to the heat sink 50, the connector 60 is inserted from the motor 2 side in the axial direction, that is, from the bottom side toward the top side, so that the fitting concave part 66 may be fitted with the fitting convex part 526.

Thus water droplets falling from the cover member 70 side flow along an outside surface of the fitting convex part 526, which fits the fitting concave part 66. It is therefore possible to restrict the water droplets from intruding into the control unit 3 through the clearance between the heat sink 50 and the connector 60. The sixth embodiment provides the similar advantage as the above-described embodiments.

Seventh Embodiment

Figure 41:
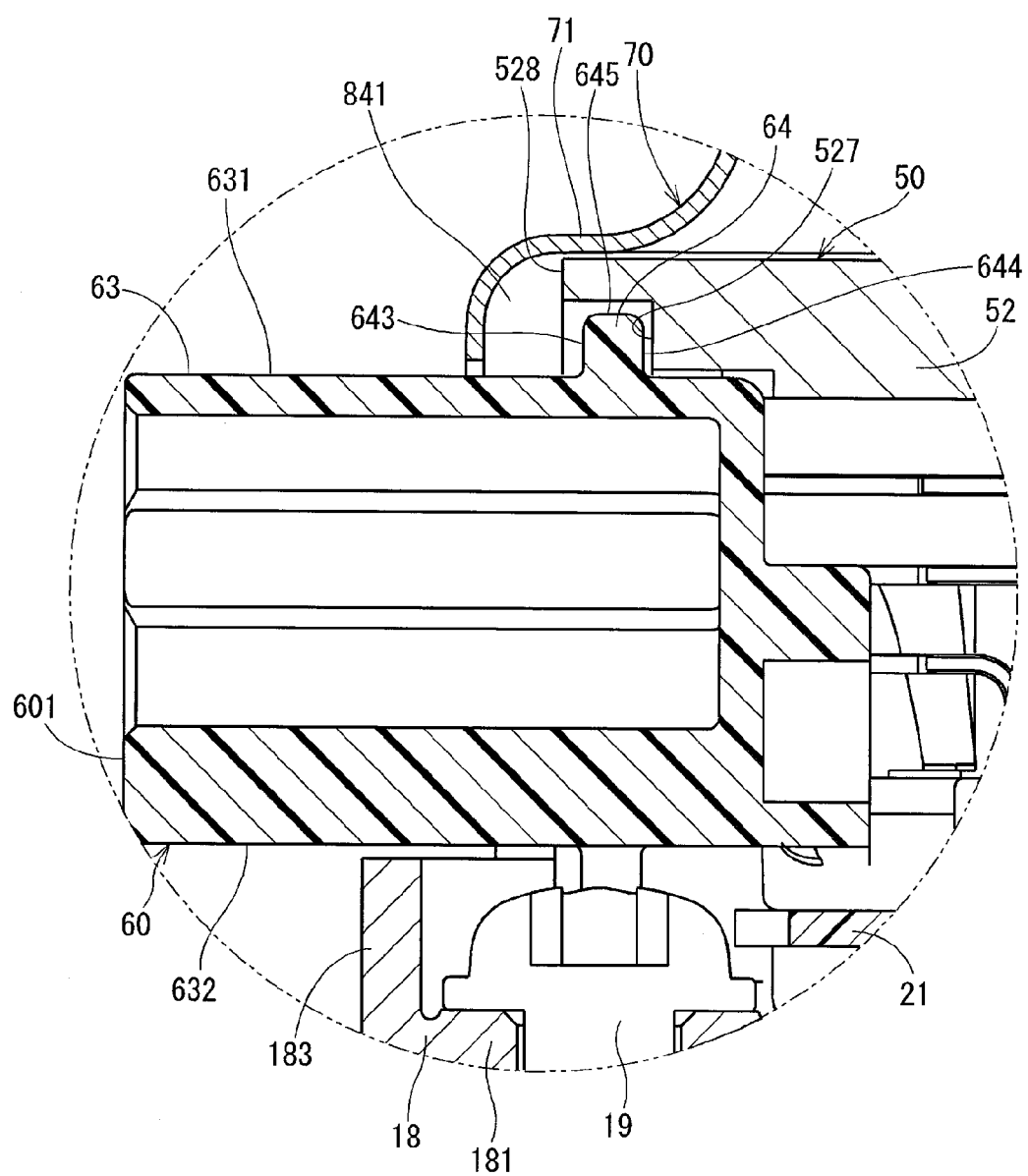
FIG. 41 is a sectional view of the heat sink and the connector according to a seventh embodiment.
Figure 42:
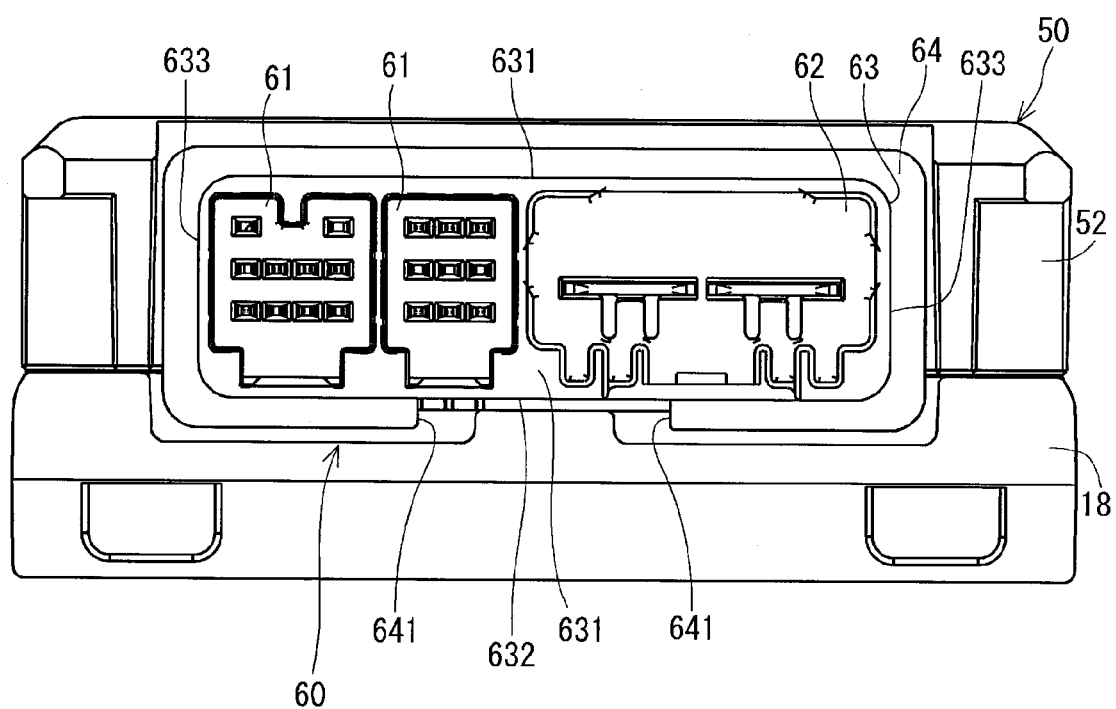
FIG. 42 is a front view of an assembly of the heat sink, the connector and the rear end frame according to the seventh embodiment.

A seventh embodiment is shown in FIG. 41 and FIG. 42. FIG. 41 corresponds to FIG. 3 and FIG. 42 corresponds to FIG. 22. In the first embodiment, the fitting groove 524 of the heat sink 50 is formed to cover the side walls 643, 644 and the top surface 645 of the flange of the connector 60. The clearance formed between the fitting groove 524 and the flange 64 is small. With such a small clearance between the fitting groove 524 and the flange 64, water droplets are suctioned by capillary action and water tends to enter into the inside part.

In the seventh embodiment, for this reason, a fitting part 527 is formed in place of the fitting groove 524 in the connector holding part 52 of the heat sink 50. The fitting part 527 is formed in a shape in a manner that the side wall 643 side of the open end 601 side of the flange 64 is open. That is, as shown in FIG. 42, the flange 64 is visible when it is viewed from the open end 601 side of the connector 60 in a state that the heat sink 50 and the connector 60 are assembled. In the first embodiment, as shown in FIG. 22, the flange 64 is covered with the connector holding part 52 and cannot be visible when viewed from the open end side 601 of the connector 60 under the state that the heat sink 50 and the connector 60 are assembled. Further, as shown in FIG. 41 and FIG. 42, a buffer chamber 841 is formed among the top end part 528 of the fitting part 527, the cover member 70 and connector 60. That is, the buffer chamber 841 is formed at the open end 601 side of the flange 64.

The buffer chamber 841 may be configured as desired in accordance with materials, shapes, surface conditions and the like of the connector 60 and the cover member 70 and sized to restrict the water droplet from entering by the capillary action into a space, which is more inside of the buffer chamber 841. For example, the buffer chamber 841 is formed to have a size, which is 2 mm or more in width and height. The width of the buffer chamber 841 corresponds to a size of the clearance in the radial direction of the drive apparatus 1 (that is, left-right direction on the sheet surface of FIG. 42). The height of the buffer chamber 841 corresponds to a size of the clearance in the axial direction of the drive apparatus 1 (that is, up-down direction to the sheet surface of FIG. 42).

A top end part 528 of the fitting part 527 is positioned closer to the open end 601 than the side wall 643 of the flange 64 is. The top end part 528 may however be positioned to be farther from the open end 601 than the side wall 643 is. For example, the top end part 528 may be formed at a position corresponding to the side wall 644, which is at the opposite side to the open end 601 of the flange 64. Even in a case that the top end part 528 is formed at a position corresponding to the side wall 644, which is at the opposite side to the open end 601 of the flange 64, the flange 64 and the fitting part 527 are considered as being fitted.

The buffer chamber 841 is formed at a fitting position, where the flange 64 and the fitting part 527 are fitted, to prevent falling water from being suctioned by capillary action. Thus it is possible to prevent water falling in droplets from entering more inside than the buffer chamber 841 due to capillary action. The seventh embodiment provides the same advantage as the foregoing embodiments. The fitting part 527 corresponds to the second fitting part.

Eighth Embodiment

Figure 43:
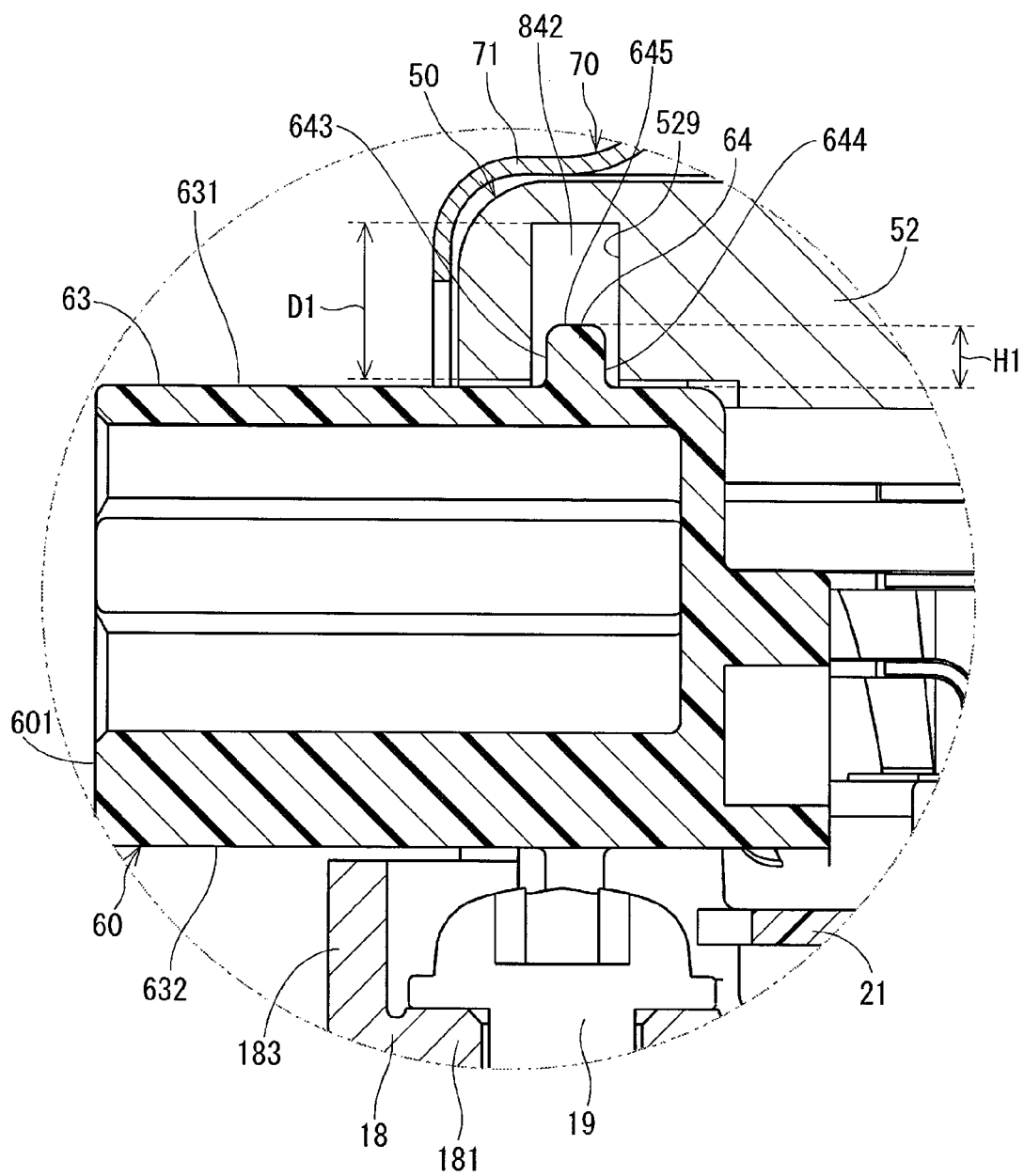
FIG. 43 is a sectional view of the heat sink and the connector according to an eighth embodiment.

An eighth embodiment is shown in FIG. 43. A fitting groove 529 is formed in the connector holding part 52 of the heat sink 50. The fitting groove 529 fits with the flange 64. The fitting groove 529 is so formed that its depth D1 is greater than the height H1 of the flange 64. A buffer chamber 842 is formed at an inside of the fitting groove 529 and between the fitting groove 529 and the top surface 645 of the flange 64. This configuration also provides the similar advantage as the seventh embodiment. The fitting groove 529 corresponds to the second fitting part.

Ninth Embodiment

Figure 44:
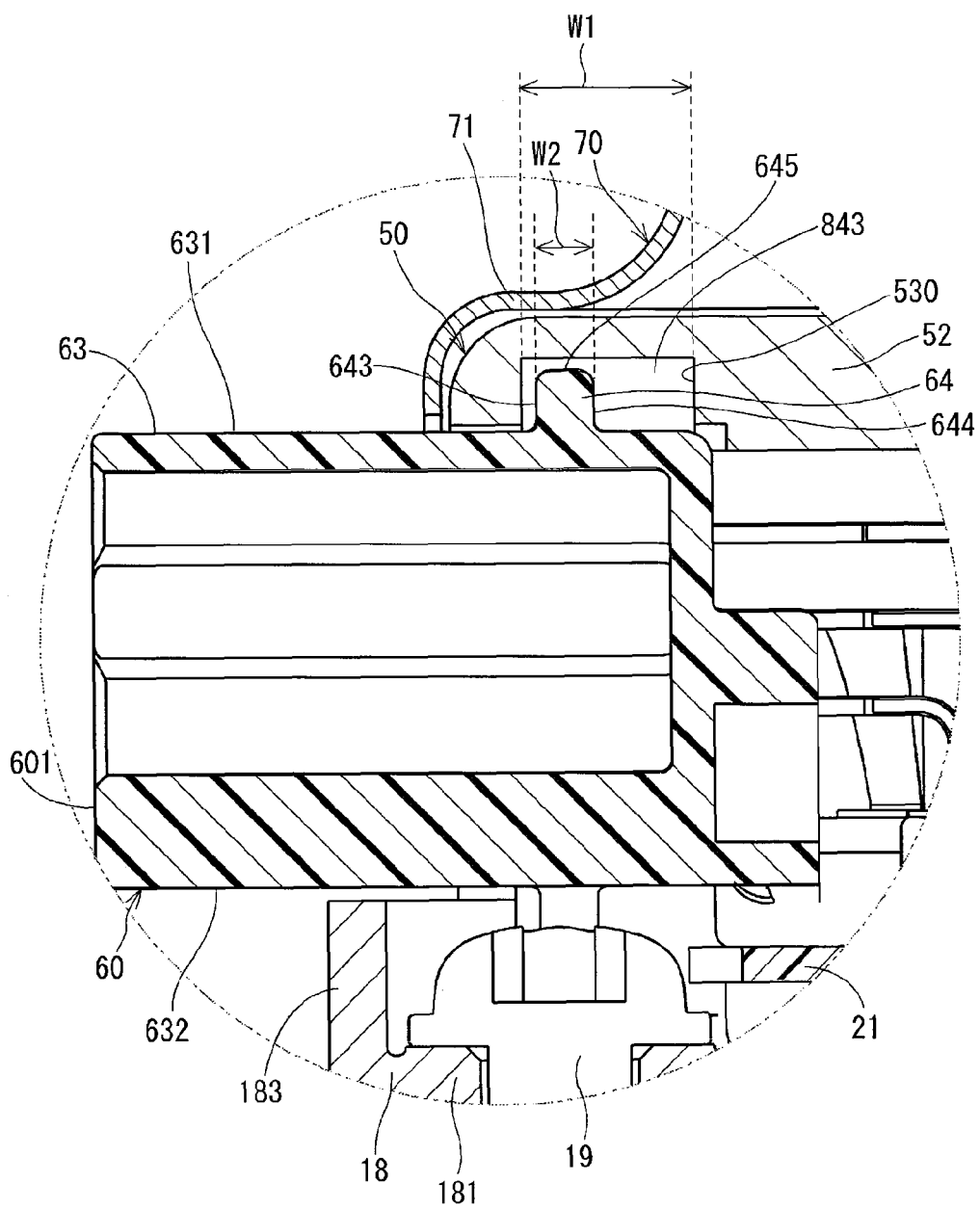
FIG. 44 is a sectional view of the heat sink and the connector according to a ninth embodiment.

A ninth embodiment of the present invention is shown in FIG. 44. A fitting groove 530 is formed in the connector holding part 52 of the heat sink 50. The fitting groove 530 fits with the flange 64. The fitting groove 530 is so formed that its width W1 is greater than the width W2 of the flange 64. A buffer chamber 843 is formed at an inside of the fitting groove 530 and between the fitting groove 530 and the side wall 644, which is opposite to the open end 601 of the flange 64. The buffer chamber 843 may however be formed at the inside of the fitting groove 530 and between the fitting groove 530 and the side wall 643, which is on the same side as the open end 601 of the flange 64. This configuration also provides the similar advantage as the seventh embodiment. The fitting groove 530 corresponds to the second fitting part.

Tenth Embodiment

Figure 40:
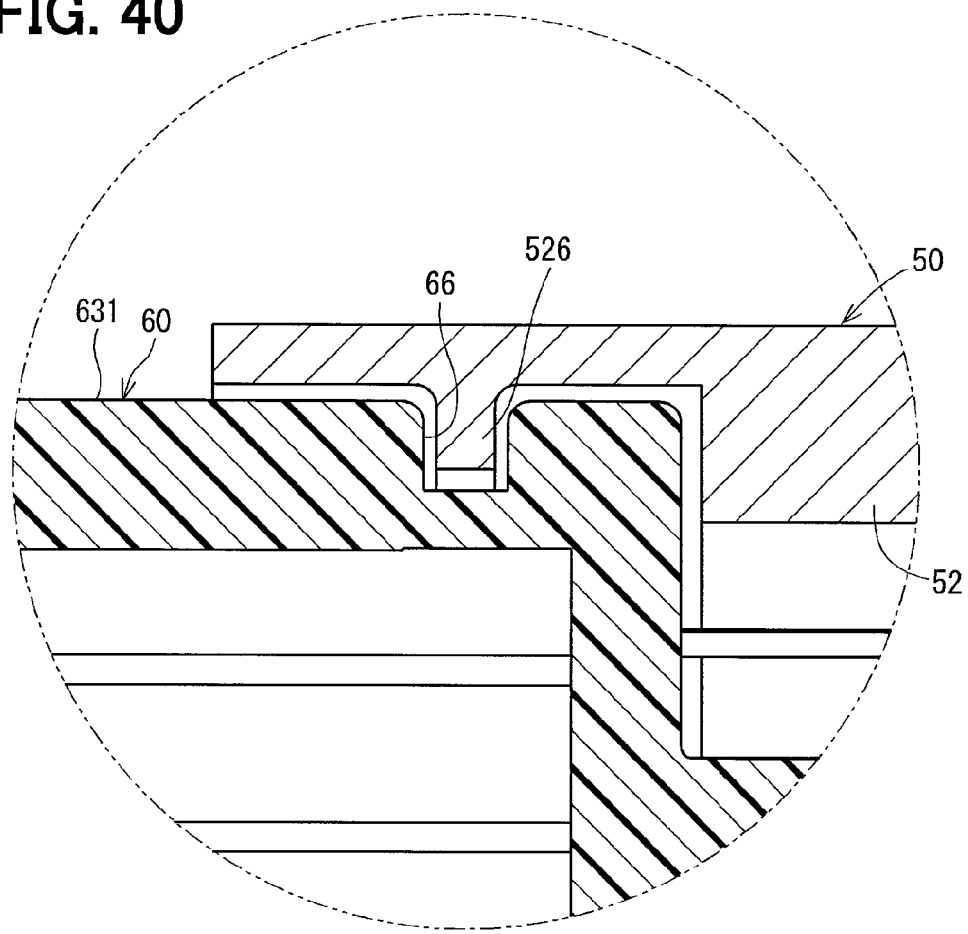
FIG. 40 is an enlarged view of a part XL in FIG. 40.
Figure 45:
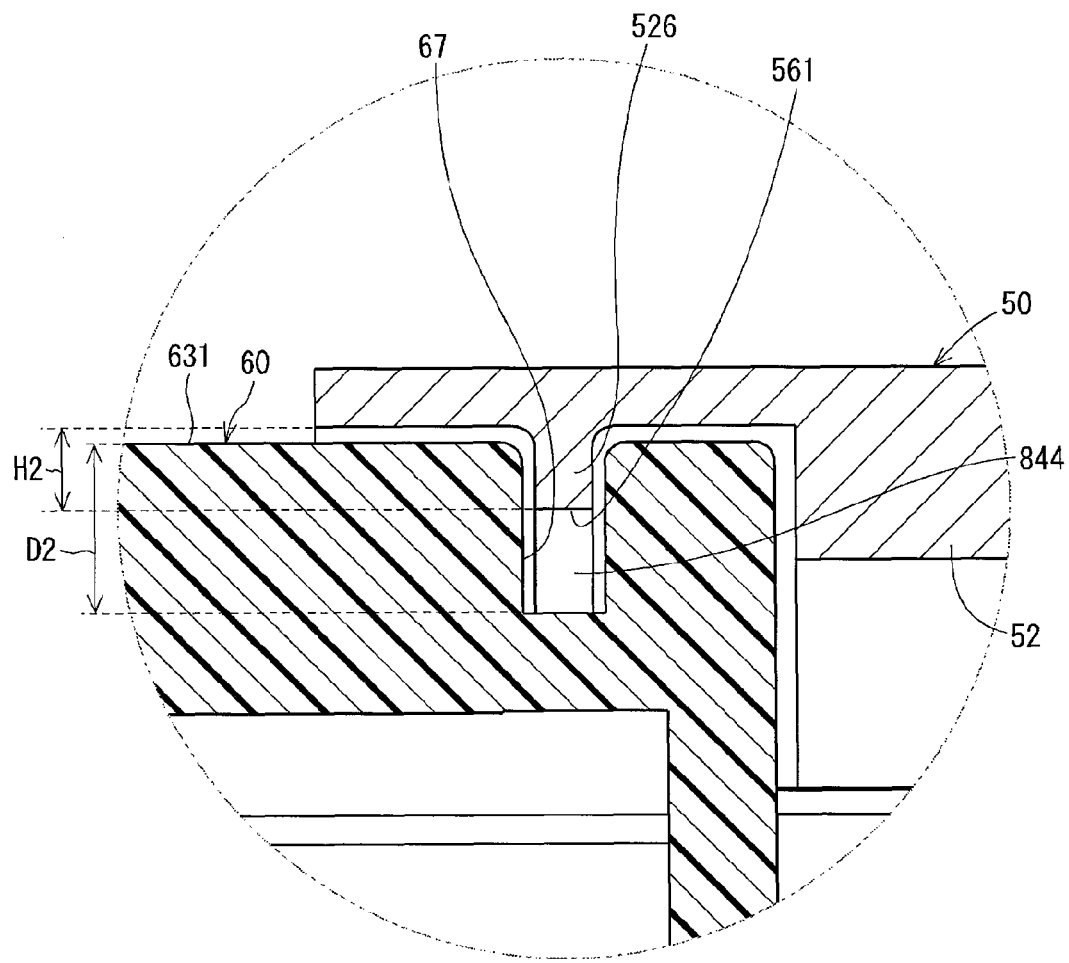
FIG. 45 is a sectional view of the heat sink and the connector according to a tenth embodiment.

A tenth embodiment is shown in FIG. 45 as a modification of the sixth embodiment. FIG. 45 corresponds to FIG. 40. A fitting concave part 67 is formed in the peripheral wall 63 of the connector. The fitting concave part 67 fits with a fitting convex part 526 of the heat sink 50. The fitting concave part 67 is so formed that its depth D2 is greater than the height H2 of the fitting convex part 526 of the heat sink 50. The buffer chamber 844 is formed at an inside of the fitting concave part 67 and between the fitting concave part 67 and the top surface 561 of the fitting convex part 526.

The fitting concave part 67 may however be formed to have a width greater than that of the fitting convex part 526 and the buffer chamber 844 may be formed at the open end 601 side of the fitting convex part 526, that is, the left side on the drawing sheet, or a side opposite to the open end 601 of the fitting convex part 526, that is, the right side of the drawing sheet. According to the present embodiment, a buffer chamber 844 is formed at a position where the fitting concave part 67 and the fitting convex part 526 are fitted. Thus it is possible to prevent water falling in droplets from entering more inside than the buffer chamber 844 due to capillary action. This embodiment also provides the same advantage as the foregoing embodiments.

Other Embodiment (A) The connector according to the above-described embodiments is the integral type, in which the control connector part and the power connector part are integrated into a single body. As the other embodiment, the control connector part and the power connector part may be a separate type. Further, as the other embodiment, the connector may be any type as far as it is usable for connection with the external part. Plural connectors may be used.

(B) In the first embodiment to the fifth embodiment, the flange of the connector is formed to extend on the first face the side surfaces and a part of the second surface. As the other embodiment, the flange need not be formed on the second surface as far it is formed on the first surface and the side faces the flange may alternatively be formed over the entire circumference of the peripheral wall.

(C) In the sixth embodiment, the fitting convex part of the connector is formed on the entire circumference of the peripheral wall. As the other embodiment, the fitting concave part need not be formed on the second surface as far as it is formed on the first surface and both of the side faces the fitting concave part may be formed to continue to extend on a part of the second surface.

(D) To drain the water droplets collected between the connector and the holding member, the first wall is formed to be lower than the second wall in the third embodiment and the first wall is cut out partly to form the drain part in the fourth embodiment. As the other embodiment, the drain part may be formed in any shape, for example, as a hole part provided in the first wall. Further, the frame member described with reference to the second to the fifth embodiments may be combined with any one of the sixth to the tenth embodiments.

(E) In the above-described embodiments, the holding member is the heat sink, which contributes to radiation of heat of the power module. Although the holding member preferably has the heat radiation function from the standpoint of reduction in the number of component parts, the heat radiation function need not be provided as far as the holding member can hold the power module and the connector.

(F) The semiconductor module is not limited to the power module, in which plural FETs are integrated as a module for each power supply path as in the above-described embodiments, but may be in any type. The switching elements are not limited to the FETs but may be any type such as IGBT or the like.

(G) In the above-described embodiments, the drive apparatus is formed of the motor and the control unit, which are integrated into a single body. As the other embodiment, the motor and the control unit may be separated. The control unit part may be used, as the drive apparatus, in devices other than the motor.

(H) In the above-described embodiments, since the motor and the control unit are integrated, the frame member provided to face the second surface side of the connector is the rear end frame, which defines the outer peripheral shape of the motor. As the other embodiment, the frame member need not be a member, which defines the outer peripheral shape of the motor but may be any other member.

(I) In the above-described embodiments, the electric motor device is the three-phase brushless motor. As the other embodiment, the electric motor device may be any motor other than the three-phase brushless motor. The electric motor device is not limited to the motor but may be a generator or a motor-generator, which has both functions of a motor and a generator.

(J) In the above-described embodiments, the drive apparatus is used in the EPS. As the other embodiment, the drive apparatus may be used for a vehicle accessory device or other devices different from the EPS.

The drive apparatus is not limited to the above-described embodiments but may be implemented differently.

What is claimed is:

1. A drive apparatus comprising:
a semiconductor module including switching elements;
a connector provided for electrical connection with an external part and including a peripheral wall and a first fitting part formed on the peripheral wall;
a holding member including a module holding part and a connector holding part, the module holding part holding the semiconductor module, and the connector holding part being provided with a second fitting part for fitting with the first fitting part and holding the connector, wherein the first fitting part is formed on a first surface of the peripheral wall, which faces an accommodation bottom part of the connector holding part, and side walls, which are formed on both sides of the first surface;
a buffer chamber formed at a fitting position, at which the first fitting part and the second fitting part are fitted each other; and
a cover member for accommodating the semiconductor module and the holding member therein; wherein:
the second fitting part is formed at a top end of the connector holding part; and
the buffer chamber is defined by the connector, the connecter holding part and the cover member.

2. The drive apparatus according to claim 1, further comprising:
an electric motor device electrically connected to the semiconductor module and the connector and provided integrally on a second surface side of the peripheral wall of the connector, the second surface being opposite to the first surface.

3. The drive apparatus according to claim 1, wherein:
the first fitting part is formed to protrude on the peripheral wall of the connector; and
the second fitting part is formed in the connector holding part in correspondence to the first fitting part.

4. The drive apparatus according to claim 1, wherein the buffer chamber is 2 mm or more in width and height.

5. The drive apparatus according to claim 1, wherein the buffer chamber has a size configured to restrict water droplets from entering by capillary action into the buffer chamber.

6. A drive apparatus comprising:
a semiconductor module including switching elements;
a connector provided for electrical connection with an external part and including a peripheral wall and a first fitting part formed on the peripheral wall;
a holding member including a module holding part and a connector holding part, the module holding part holding the semiconductor module, and the connector holding part being provided with a second fitting part for fitting with the first fitting part and holding the connector, wherein the first fitting part is formed on a first surface of the peripheral wall, which faces an accommodation bottom part of the connector holding part, and side walls, which are formed on both sides of the first surface;
a buffer chamber formed at a fitting position, at which the first fitting part and the second fitting part are fitted to each other; and
a frame member provided on the second surface side, which is opposite to the first surface.

7. The drive apparatus according to claim 6, wherein:
the frame member has at least one of a first wall part and a second wall part at a location, which faces the connector of the frame member, the first wall part being formed outside the first fitting part and the second wall part being formed inside the first fitting part.

8. The drive apparatus according to claim 7, wherein:
the first wall part and the second wall part are both provided on the frame member.

9. The drive apparatus according to claim 8, wherein:
the first wall part is lower than the second wall part.

10. The drive apparatus according to claim 7, wherein:
the first wall part has a drain part formed to drain water droplets, which flow along the first fitting part or the second fitting part.

11. The drive apparatus according to claim 6, wherein:
the frame member has a planar part formed at a position, which faces the connector.

* * * * *